(12) United States Patent
Blakely et al.

(10) Patent No.: US 12,051,769 B2
(45) Date of Patent: Jul. 30, 2024

(54) INTEGRATED WARNING STRUCTURES FOR ENERGIZED ULTRAVIOLET LIGHT-EMITTING DIODE PACKAGES

(71) Applicant: CreeLED, Inc., Durham, NC (US)

(72) Inventors: Colin Blakely, Raleigh, NC (US); Andre Pertuit, Raleigh, NC (US)

(73) Assignee: CreeLED, Inc., Durham, NC (US)

( * ) Notice: Subject to any disclaimer, the term of this patent is extended or adjusted under 35 U.S.C. 154(b) by 186 days.

(21) Appl. No.: 17/500,219

(22) Filed: Oct. 13, 2021

(65) Prior Publication Data

US 2023/0112649 A1 Apr. 13, 2023

(51) Int. Cl.
| | |
|---|---|
| *H01L 33/50* | (2010.01) |
| *H01L 33/48* | (2010.01) |
| *H01L 33/58* | (2010.01) |
| *H01L 33/62* | (2010.01) |

(52) U.S. Cl.
CPC .......... *H01L 33/502* (2013.01); *H01L 33/483* (2013.01); *H01L 33/62* (2013.01); *H01L 2933/0041* (2013.01)

(58) Field of Classification Search
CPC ............................. H01L 33/502; H01L 33/483
See application file for complete search history.

(56) References Cited

U.S. PATENT DOCUMENTS

| | | | |
|---|---|---|---|
| 7,005,679 B2 | 2/2006 | Tarsa et al. | |
| 7,282,744 B2 | 10/2007 | Flynn et al. | |
| 7,791,092 B2 | 9/2010 | Tarsa et al. | |
| 8,772,757 B2 | 7/2014 | Emerson et al. | |
| 8,901,585 B2 | 12/2014 | Tarsa et al. | |
| 9,935,246 B2 | 4/2018 | Williams et al. | |

(Continued)

FOREIGN PATENT DOCUMENTS

EP 3633742 A1 4/2020

OTHER PUBLICATIONS

International Search Report and Written Opinion for International Patent Application No. PCT/US2022/077833, mailed Feb. 2, 2023, 22 pages.

(Continued)

*Primary Examiner* — Walter H Swanson
*Assistant Examiner* — Jacob T Nelson
(74) *Attorney, Agent, or Firm* — Withrow & Terranova, P.L.L.C.

(57) ABSTRACT

Solid-state lighting devices including light-emitting diodes (LEDs), and more particularly integrated warning structures for ultraviolet LED packages are disclosed. Integrated warning structures may include passive structures, such as lumiphoric material regions, that are arranged within LED packages to receive a portion of ultraviolet light from an LED chip within the LED package and provide a small amount of wavelength-converted light. Such wavelength-converted light may serve as indication that ultraviolet light is being emitted. Exemplary lumiphoric material regions may form one or more discrete regions within LED packages and may provide such wavelength-converted light without substantial impact on color purity of the LED packages. Accordingly, LED packages may provide integrated warning emissions that may serve to indicate the presence of ultraviolet emissions and/or reduce human exposure to such ultraviolet emissions.

32 Claims, 10 Drawing Sheets

(56) References Cited

U.S. PATENT DOCUMENTS

| | | |
|---|---|---|
| 2009/0045718 A1 | 2/2009 | Auer et al. |
| 2012/0306370 A1* | 12/2012 | Van De Ven .......... H05B 45/28 |
| | | 315/192 |
| 2013/0020929 A1* | 1/2013 | Van de Ven ........ H01L 25/0753 |
| | | 313/498 |
| 2013/0078411 A1 | 3/2013 | Gaska et al. |
| 2015/0260357 A1* | 9/2015 | Liaw ......................... F21K 9/62 |
| | | 362/231 |
| 2016/0027970 A1* | 1/2016 | Shatalov ................. H01L 24/97 |
| | | 438/27 |
| 2019/0098969 A1 | 4/2019 | Gibson et al. |
| 2022/0190208 A1 | 6/2022 | Miller et al. |

OTHER PUBLICATIONS

Preliminary Examination Report for Taiwanese Patent Application No. 111138068, mailed May 30, 2023, 17 pages.

\* cited by examiner

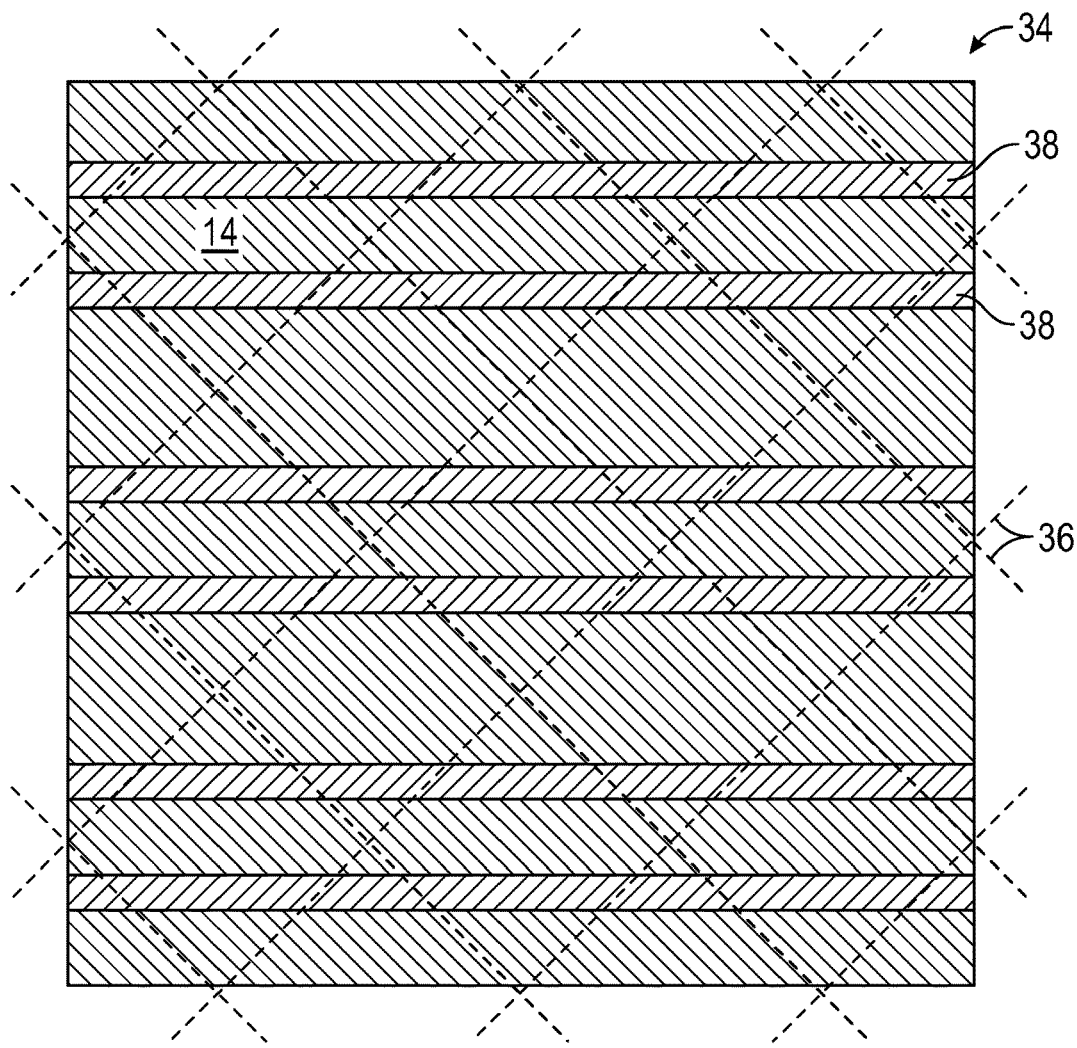
FIG. 4A
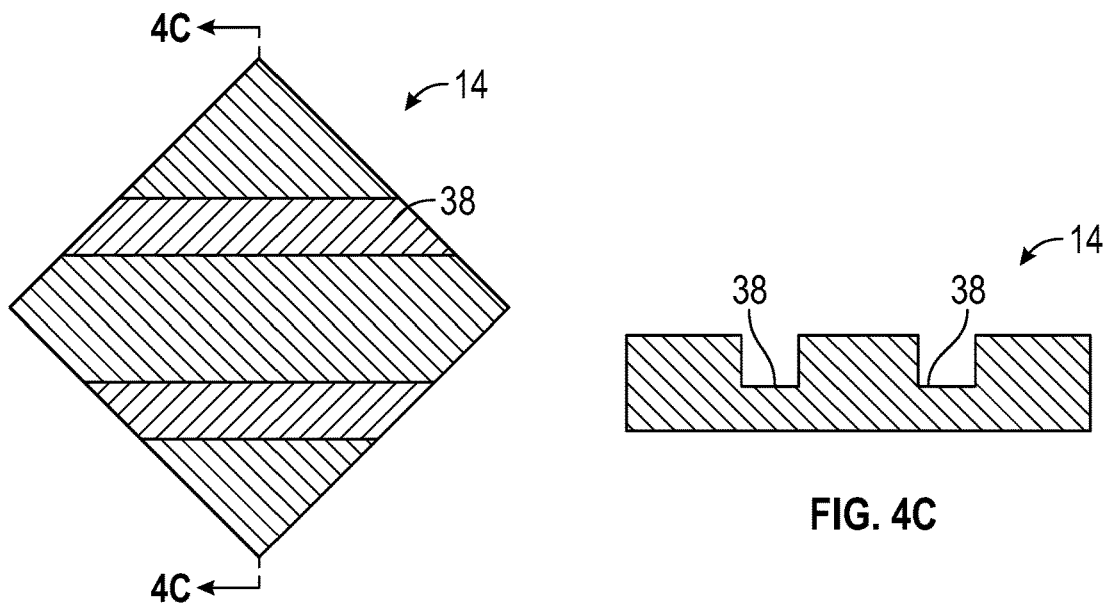
FIG. 4B
FIG. 4C

INTEGRATED WARNING STRUCTURES FOR ENERGIZED ULTRAVIOLET LIGHT-EMITTING DIODE PACKAGES

FIELD OF THE DISCLOSURE

The present disclosure relates to solid-state lighting devices including light-emitting diodes (LEDs), and more particularly to integrated warning structures for ultraviolet LED packages.

BACKGROUND

Solid-state lighting devices such as light-emitting diodes (LEDs) are increasingly used in both consumer and commercial applications. Advancements in LED technology have resulted in highly efficient and mechanically robust light sources with a long service life. Accordingly, modern LEDs have enabled a variety of new display applications and are being increasingly utilized for general illumination applications, often replacing incandescent and fluorescent light sources.

LEDs are solid-state devices that convert electrical energy to light and generally include one or more active layers of semiconductor material (or an active region) arranged between oppositely doped n-type and p-type layers. When a bias is applied across the doped layers, holes and electrons are injected into the one or more active layers where they recombine to generate emissions such as visible light or ultraviolet emissions. An LED chip typically includes an active region that may be fabricated, for example, from silicon carbide, gallium nitride, gallium phosphide, aluminum nitride, gallium arsenide-based materials, and/or from organic semiconductor materials. Photons generated by the active region are initiated in all directions. LED packages have been developed that can provide mechanical support, electrical connections, and encapsulation for LED chips. LED chips and corresponding LED packages with ultraviolet emissions are of particular interest for use in applications related to the disinfection of microorganisms in air, water, and surfaces, among others.

The art continues to seek improved LEDs and solid-state lighting devices having desirable illumination characteristics capable of overcoming challenges associated with conventional devices.

SUMMARY

The present disclosure relates to solid-state lighting devices including light-emitting diodes (LEDs), and more particularly to integrated warning structures for ultraviolet (UV) LED packages. Integrated warning structures may include passive structures, such as lumiphoric material regions, that are arranged within LED packages to receive a portion of UV light from an LED chip within the LED package and provide a small amount of wavelength-converted light. Such wavelength-converted light may serve as indication that UV light is being emitted. Exemplary lumiphoric material regions may form one or more discrete regions within LED packages and may provide such wavelength-converted light without substantial impact on color purity of the LED packages. Accordingly, LED packages may provide integrated warning emissions that may serve to indicate the presence of UV emissions and/or reduce human exposure to such UV emissions.

In one aspect, an LED package comprises: a support structure comprising at least one of a submount and a lead frame structure; at least one LED chip on the support structure, wherein the at least one LED chip is configured to emit light with a first peak wavelength in a range from 100 nanometers (nm) to 400 nm; and a lumiphoric material region that is arranged to receive a portion of the light of the first peak wavelength and provide light with a second peak wavelength that is different than the first peak wavelength; wherein a combined light output from the at least one LED chip and the lumiphoric material region comprises a purity with respect to the first peak wavelength that is greater than 95%. In certain embodiments, the purity is greater than 99%, or greater than 99.5%. In certain embodiments, the second peak wavelength is in a range from 400 nm to 700 nm, or in a range from 700 nm to 2500 nm. In certain embodiments, the first peak wavelength is in a range from 100 nm to 315 nm and the second peak wavelength is in a range from 400 nm to 440 nm.

In certain embodiments, the lumiphoric material region is a discrete region that is laterally spaced from the at least one LED chip. In certain embodiments, a total area of a top surface of the lumiphoric material region is no more than 15% of an area of a top surface of the at least one LED chip. In other embodiments, a total area of a top surface of the lumiphoric material region is at least 50% of an area of a top surface of the at least one LED chip. In certain embodiments, the lumiphoric material region comprises phosphor particles in a binder and a ratio of the phosphor particles to the binder is in a range from 5 to 1 to 15 to 1. In certain embodiments, the lumiphoric material region comprises at least one of a ceramic material, a phosphor-in-glass structure, and a mixture of phosphor particles and silver. In certain embodiments, the lumiphoric material region forms at least one of a polarity indicator, a logo, a symbol, and an alphanumeric character on the submount. In certain embodiments, the lumiphoric material region comprises a number of nonplanar features. In certain embodiments, the lumiphoric material region is provided within a light-altering material that laterally surrounds the at least one LED chip, wherein the light-altering material comprises at least one of light-reflective particles and light-refractive particles that are dispersed with the lumiphoric material region within a binder.

In another aspect, an LED package comprises: a support structure; at least one LED chip mounted on a surface of the support structure, wherein the at least one LED chip is configured to emit light with a first peak wavelength in a range from 100 nm to 400 nm; and a lumiphoric material region that is arranged to receive a portion of the light of the first peak wavelength and provide light with a second peak wavelength that is different than the first peak wavelength, wherein the lumiphoric material region is a discrete region that is laterally spaced from the at least one LED chip in a direction that is parallel to the surface of the support structure on which the at least one LED chip is mounted. In certain embodiments, the support structure is a submount with one or more patterned electrical traces, and the surface of the support structure on which the at least one LED chip is mounted is a portion of the one or more patterned electrical traces. The LED package may further comprise a cover structure over the at least one LED chip, wherein the cover structure is attached to a portion of the submount that is adjacent the at least one LED chip. In certain embodiments, the lumiphoric material region is arranged at an attachment interface between the cover structure and the submount. In certain embodiments, the lumiphoric material region forms a continuous shape that laterally surrounds the at least one LED chip. The LED package may further comprise at least one electrically conductive via within the submount, wherein the at least one electrically conductive via is electrically coupled to a portion of the one or more patterned electrical traces, and the lumiphoric material region is vertically aligned with the at least one electrically conductive via. In certain embodiments, a concentration of lumiphoric material in the lumiphoric material region is graded. In certain embodiments, the support structure is a lead frame structure with one or more metal leads and an insulating housing. In certain embodiments, the surface of the support structure on which the at least one LED chip is mounted is a portion of the one or more metal leads. In certain embodiments, the surface of the support structure on which the at least one LED chip is mounted is a portion of the insulating housing.

In another aspect, a method of making an LED package comprises: providing a support structure; mounting at least one LED chip on a surface of the support structure, wherein the at least one LED chip is configured to emit light with a first peak wavelength in a range from 100 nm to 400 nm; and providing a lumiphoric material region that is arranged to receive a portion of the light of the first peak wavelength and provide light with a second peak wavelength that is different than the first peak wavelength, wherein the lumiphoric material region is a discrete region that is laterally spaced from the at least one LED chip in a direction that is parallel to the surface of the support structure on which the at least one LED chip is mounted. In certain embodiments, providing the lumiphoric material region comprises selectively depositing the lumiphoric material region on a portion of the support structure. In certain embodiments, providing the lumiphoric material region comprises forming the lumiphoric material region as a pre-formed structure and attaching the pre-formed structure to the support structure. The method may further comprise: providing a cover structure that is attached to the support structure over the at least one LED chip; wherein providing the lumiphoric material region comprises providing the lumiphoric material region on or within a portion of the cover structure. In certain embodiments, a combined light output from the at least one LED chip and the lumiphoric material region comprises a purity with respect to the first peak wavelength that is greater than 95%. In certain embodiments, a total area of the lumiphoric material region is no more than 15% of an area of a top surface of the at least one LED chip. In certain embodiments, a total area of the lumiphoric material region is at least 50% of an area of a top surface of the at least one LED chip. In certain embodiments, the lumiphoric material region comprises phosphor particles in a binder and a ratio of the phosphor particles to the binder is in a range from 5 to 1 to 15 to 1.

In another aspect, any of the foregoing aspects individually or together, and/or various separate aspects and features as described herein, may be combined for additional advantage. Any of the various features and elements as disclosed herein may be combined with one or more other disclosed features and elements unless indicated to the contrary herein.

Those skilled in the art will appreciate the scope of the present disclosure and realize additional aspects thereof after reading the following detailed description of the preferred embodiments in association with the accompanying drawing figures.

BRIEF DESCRIPTION OF THE DRAWING FIGURES

The accompanying drawing figures incorporated in and forming a part of this specification illustrate several aspects of the disclosure, and together with the description serve to explain the principles of the disclosure.

FIG. 4A is a top view of a lumiphoric material sheet that may be subdivided into individual lumiphoric material regions that provide pre-formed structures for LED packages.

FIG. 4B is a top view of an individual lumiphoric material region that is singulated from the lumiphoric material sheet of FIG. 4A.

FIG. 4C is a cross-sectional view of the lumiphoric material region of FIG. 4B taken along the sectional line 4C-4C of FIG. 4B.

DETAILED DESCRIPTION

Figure 1A:
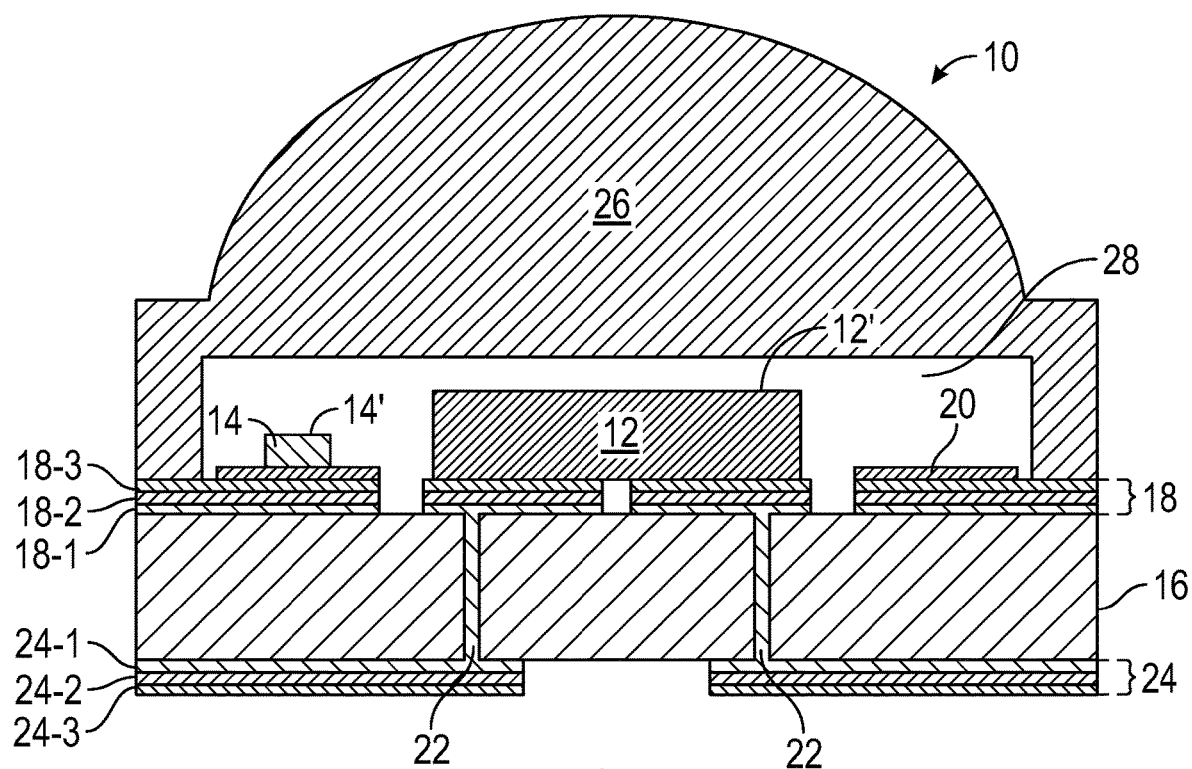
FIG. 1A is a cross-sectional view of a light-emitting diode (LED) package that includes an LED chip configured to provide ultraviolet (UV) emissions and a lumiphoric material region that is separately arranged from the LED chip in order to provide wavelength-converted light to indicate when the LED chip is electrically activated.

The embodiments set forth below represent the necessary information to enable those skilled in the art to practice the embodiments and illustrate the best mode of practicing the embodiments. Upon reading the following description in light of the accompanying drawing figures, those skilled in the art will understand the concepts of the disclosure and will recognize applications of these concepts not particularly addressed herein. It should be understood that these concepts and applications fall within the scope of the disclosure and the accompanying claims.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present disclosure. As used herein, the term "and/or" includes any and all combinations of one or more of the associated listed items.

It will be understood that when an element such as a layer, region, or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present. Likewise, it will be understood that when an element such as a layer, region, or substrate is referred to as being "over" or extending "over" another element, it can be directly over or extend directly over the other element or intervening elements may also be present. In contrast, when an element is referred to as being "directly over" or extending "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Relative terms such as "below" or "above" or "upper" or "lower" or "horizontal" or "vertical" may be used herein to describe a relationship of one element, layer, or region to another element, layer, or region as illustrated in the Figures. It will be understood that these terms and those discussed above are intended to encompass different orientations of the device in addition to the orientation depicted in the Figures.

The terminology used herein is for the purpose of describing particular embodiments only and is not intended to be limiting of the disclosure. As used herein, the singular forms "a," "an," and "the" are intended to include the plural forms as well, unless the context clearly indicates otherwise. It will be further understood that the terms "comprises," "comprising," "includes," and/or "including" when used herein specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this disclosure belongs. It will be further understood that terms used herein should be interpreted as having a meaning that is consistent with their meaning in the context of this specification and the relevant art and will not be interpreted in an idealized or overly formal sense unless expressly so defined herein.

Embodiments are described herein with reference to schematic illustrations of embodiments of the disclosure. As such, the actual dimensions of the layers and elements can be different, and variations from the shapes of the illustrations as a result, for example, of manufacturing techniques and/or tolerances, are expected. For example, a region illustrated or described as square or rectangular can have rounded or curved features, and regions shown as straight lines may have some irregularity. Thus, the regions illustrated in the figures are schematic and their shapes are not intended to illustrate the precise shape of a region of a device and are not intended to limit the scope of the disclosure. Additionally, sizes of structures or regions may be exaggerated relative to other structures or regions for illustrative purposes and, thus, are provided to illustrate the general structures of the present subject matter and may or may not be drawn to scale. Common elements between figures may be shown herein with common element numbers and may not be subsequently re-described.

The present disclosure relates to solid-state lighting devices including light-emitting diodes (LEDs), and more particularly to integrated warning structures for ultraviolet (UV) LED packages. Integrated warning structures may include passive structures, such as lumiphoric material regions, that are arranged within LED packages to receive a portion of UV light from an LED chip within the LED package and provide a small amount of wavelength-converted light. Such wavelength-converted light may serve as indication that UV light is being emitted. Exemplary lumiphoric material regions may form one or more discrete regions within LED packages and may provide such wavelength-converted light without substantial impact on color purity of the LED packages. Accordingly, LED packages may provide integrated warning emissions that may serve to indicate the presence of UV emissions and/or reduce human exposure to such UV emissions.

Before delving into specific details of various aspects of the present disclosure, an overview of various elements that may be included in exemplary LED packages of the present disclosure is provided for context. An LED chip typically comprises an active LED structure or region that can have many different semiconductor layers arranged in different ways. The fabrication and operation of LEDs and their active structures are generally known in the art and are only briefly discussed herein. The layers of the active LED structure can be fabricated using known processes with a suitable process being fabrication using metal organic chemical vapor deposition. The layers of the active LED structure can comprise many different layers and generally comprise an active layer sandwiched between n-type and p-type oppositely doped epitaxial layers, all of which are formed successively on a growth substrate. It is understood that additional layers and elements can also be included in the active LED structure, including, but not limited to, buffer layers, nucleation layers, super lattice structures, undoped layers, cladding layers, contact layers, and current-spreading layers and light extraction layers and elements. The active layer can comprise a single quantum well, a multiple quantum well, a double heterostructure, or super lattice structures.

Different embodiments of the active LED structure can emit different wavelengths of light depending on the composition of the active layer and n-type and p-type layers. In many applications, active LED structures are configured to emit visible light, such as blue light with a peak wavelength range of approximately 430 nanometers (nm) to 480 nm, green light with a peak wavelength range of 500 nm to 570 nm, or red light with a peak wavelength range of 600 nm to 650 nm, among other visible light colors. In certain aspects of the present disclosure, the active LED structure may be configured to emit light that is outside the visible spectrum, including one or more portions of the UV spectrum. The UV spectrum is typically divided into three wavelength range categories denoted with letters A, B, and C. In this manner, UV-A light is typically defined as a peak wavelength range from 315 nm to 400 nm, UV-B is typically defined as a peak wavelength range from 280 nm to 315 nm, and UV-C is typically defined as a peak wavelength range from 100 nm to 280 nm. UV LEDs are of particular interest for use in applications related to the disinfection of microorganisms in air, water, and surfaces, among others.

According to the aspects of the present disclosure, lumiphoric materials may be arranged to receive at least a portion of light emitting from active LED structures. Lumiphoric materials, which may also be referred to herein as lumiphors, may be configured such that at least some of the light from the active LED structure of an LED chip is absorbed by the lumiphoric material and is converted to one or more different wavelength spectra. Stated differently, the lumiphoric material may receive at least a portion of the light generated by an LED source and re-emit light having a different peak wavelength than the LED source. In certain embodiments, lumiphoric materials may emit one or more wavelengths in the visible spectrum from 380 nm to 700 nm, or from 400 nm to 700 nm, such as one or more of violet, blue, cyan, green, amber, yellow, orange, and/or red peak wavelengths, in response to receiving nonvisible light, such as UV light.

Lumiphoric materials as described herein may be or include one or more of a phosphor, a scintillator, a lumiphoric ink, a quantum dot material, a day glow tape, and the like. Lumiphoric materials may be provided by any suitable means, for example, direct coating on one or more surfaces of an LED or LED package, dispersal in an encapsulant material that is arranged proximate an LED, and/or coating on one or more optical or support elements. In certain embodiments, multiple different (e.g., compositionally different) lumiphoric materials arranged to produce different peak wavelengths may be arranged to receive emissions from one or more LED chips. One or more lumiphoric materials may be provided on or near one or more portions of an LED chip in various configurations. In certain embodiments, one or more lumiphoric materials may be arranged proximate an LED chip while one or more surfaces of the LED chip are devoid of lumiphoric materials. In certain embodiments, the lumiphoric materials may be conformally coated over various surfaces of an LED package. In certain embodiments, one or more lumiphoric materials may be arranged in a substantially uniform manner while in other embodiments, one or more lumiphoric materials may be arranged in a manner that is non-uniform with respect to one or more of material composition, concentration, and thickness. In certain embodiments, the loading percentage of one or more lumiphoric materials may be varied. In certain embodiments, one or more lumiphoric materials may be patterned on portions of one or more surfaces to include one or more stripes, dots, curves, or polygonal shapes. In certain embodiments, multiple lumiphoric materials may be arranged in different discrete regions or discrete layers.

Light emitted by the active layer or region of an LED chip typically has a lambertian emission pattern. For directional applications, internal mirrors or external reflective surfaces may be employed to redirect as much light as possible toward a desired emission direction. Internal mirrors may include single or multiple layers. Some multi-layer mirrors include a metal reflective layer and a dielectric reflective layer, wherein the dielectric reflective layer is arranged between the metal reflective layer and a plurality of semiconductor layers. A passivation layer is arranged between the metal reflective layer and first and second electrical contacts, wherein the first electrical contact is arranged in conductive electrical communication with a first semiconductor layer, and the second electrical contact is arranged in conductive electrical communication with a second semiconductor layer.

As used herein, a layer or region of a light-emitting device may be considered to be "transparent" when at least 80% of emitted radiation that impinges on the layer or region emerges through the layer or region. Moreover, as used herein, a layer or region of an LED is considered to be "reflective" or embody a "mirror" or a "reflector" when at least 80% of the emitted radiation that impinges on the layer or region is reflected. In some embodiments, the emitted radiation comprises visible light such as blue and/or green LEDs with or without lumiphoric materials. In other embodiments, the emitted radiation may comprise nonvisible light. For example, in the context of gallium nitride (GaN)-based blue and/or green LEDs, silver (Ag) may be considered a reflective material (e.g., at least 80% reflective) . In the case of UV LEDs, appropriate materials may be selected to provide a desired, and in some embodiments high, reflectivity and/or a desired, and in some embodiments low, absorption. In certain embodiments, a "light-transmissive" material may be configured to transmit at least 50% of emitted radiation of a desired wavelength.

The present disclosure can be useful for LED chips having a variety of geometries, such as vertical geometry or lateral geometry. A vertical geometry LED chip typically includes anode and cathode connections on opposing sides or faces of the LED chip. A lateral geometry LED chip typically includes both anode and cathode connections on the same side of the LED chip that is opposite a substrate, such as a growth substrate. In certain embodiments, a lateral geometry LED chip may be mounted on a submount of an LED package such that the anode and cathode connections are on a face of the LED chip that is opposite the submount. In this configuration, wirebonds may be used to provide electrical connections with the anode and cathode connections. In other embodiments, a lateral geometry LED chip may be flip-chip mounted on a surface of a submount of an LED package such that the anode and cathode connections are on a face of the active LED structure that is adjacent to the submount. In this configuration, electrical traces or patterns may be provided on the submount for providing electrical connections to the anode and cathode connections of the LED chip. In a flip-chip configuration, the active LED structure is configured between the substrate of the LED chip and the submount for the LED package. Accordingly, light emitted from the active LED structure may pass through the substrate in a desired emission direction. In other embodiments, an active LED structure may be bonded to a carrier submount, and the growth substrate may be removed such that light may exit the active LED structure without passing through the growth substrate.

According to aspects of the present disclosure, LED packages may include one or more elements, such as lumiphoric materials, encapsulants, light-altering materials, lenses, and electrical contacts, among others, that are arranged with one or more LED chips. In certain aspects, an LED package may include a support structure, such as a submount or a leadframe. Suitable materials for the submount include, but are not limited to, ceramic materials such as aluminum oxide or alumina, aluminum nitride (AlN), or organic insulators like polyimide (PI) and polyphthalamide (PPA). In other embodiments, a submount may comprise a printed circuit board (PCB), sapphire, silicon (Si) or any other suitable material. For PCB embodiments, different PCB types can be used such as standard FR-4 PCB, metal core PCB, or any other type of PCB. In still further embodiments, the support structure may embody a lead frame structure. Light-altering materials may be arranged within LED packages to reflect or otherwise redirect light from the one or more LED chips in a desired emission direction or pattern.

As used herein, light-altering materials may include many different materials including light-reflective materials that reflect or redirect light, light-absorbing materials that absorb light, and materials that act as a thixotropic agent. As used herein, the term "light-reflective" refers to materials or particles that reflect, refract, scatter, or otherwise redirect light. For light-reflective materials, the light-altering material may include at least one of fused silica, fumed silica, titanium dioxide ($TiO_2$), or metal particles suspended in a binder, such as silicone or epoxy. In certain aspects, the particles may have an index or refraction that is configured to refract light emissions in a desired direction. In certain aspects, light-reflective particles may also be referred to as light-scattering particles. A weight ratio of the light-reflective particles or scattering particles to a binder may comprise a range of about 1:1 to about 2:1, among others. For light-absorbing materials, the light-altering material may include at least one of carbon, silicon, or metal particles suspended in a binder, such as silicone or epoxy. The light-reflective materials and the light-absorbing materials may comprise nanoparticles. In certain embodiments, the light-altering material may comprise a generally white color to reflect and redirect light. In other embodiments, the light-altering material may comprise a generally opaque or black color for absorbing light and increasing contrast. In certain embodiments, the light-altering material includes both light-reflective material and light-absorbing material suspended in a binder.

Aspects of the present disclosure are provided in the context of LED packages with one or more LED chips that may emit light in any number of wavelength ranges, including wavelengths within UV spectrums. As previously described, UV LEDs are of particular interest for use in applications related to the disinfection of microorganisms in air, water, and surfaces, among others. Certain embodiments of the present disclosure may be well suited for applications where LED emissions are provided in one or more of the UV-A, UV-B, and UV-C wavelength ranges. Lower peak wavelengths, such as peak wavelengths in one or more of the UV-B range (e.g., 280 nm to 315 nm) and the UV-C range (e.g., 100 nm to 280 nm) may have high energy levels that can lead to breakdown of materials commonly used in other LED packages, including silicone, polymers, and/or other organic materials that are commonly used as encapsulants and/or binders for reflective particles and/or lumiphoric materials. Cover structures and/or lenses for UV-based LED packages may also need to provide protection from external environmental exposure, such as providing hermetic sealing and the like. In this manner, cover structures for UV LEDs may include at least one of glass, quartz, and/or ceramic materials that provide reduced breakdown from exposure to UV emissions while also being able to be attached or otherwise bonded to package support structures to seal underlying LED chips.

Support structures for LED packages may include one or more electrically conductive materials that may provide electrical connections to LED chips. Electrically conductive materials may be provided as traces or patterned traces on a submount, or the electrically conductive materials may form a lead frame structure that may or may not include a corresponding submount. The electrically conductive materials may include any number of materials, including copper (Cu) or alloys thereof, nickel (Ni) or alloys thereof, nickel chromium (NiCr), gold (Au) or alloys thereof, electroless Au, electroless silver (Ag), NiAg, Al or alloys thereof, titanium tungsten (TiW), titanium tungsten nitride (TiWN), electroless nickel electroless palladium immersion gold (ENEPIG), electroless nickel immersion gold (ENIG), hot air solder leveling (HASL), and organic solderability preservative (OSP). In certain embodiments, the electrically conductive materials may include ENEPIG or ENIG that include a top layer of Au. In other embodiments, electrically conductive materials may include a top layer of Ag. For UV-B and UV-C wavelength spectrums, Au and Ag may exhibit poor reflectivity (e.g., about 20% to 40% reflectivity). In this regard, electrically conductive materials may include a top layer of Al to provide increased reflectivity, particularly for UV-B and UV-C emissions.

When UV LEDs are energized, or electrically activated, light emissions are not visible to the human eye. In this regard, a person who is proximate a UV LED has no way of visually determining the presence of UV light. This may pose various problems, including safety and/or detection of problems with operation of the UV LEDS. UV emissions are known to be harmful for human exposure. For example, even brief exposure to UV-C light may result in damage to the skin and/or photokeratitis of the eyes. The nonvisible nature of UV light also poses other problems for operators, including not knowing if parts have failed or degraded during operation. In this manner, an operator could use a defective UV LED to treat a surface without knowing that the LED has actually failed or degraded.

According to aspects of the present disclosure, an integrated warning structure is arranged within a UV LED package that provides an indicator that the UV LED is energized and emitting UV light. The integrated warning structure may be provided in the form of a passive structure that is arranged in a light path of UV emissions within a UV LED package. For example, a discrete region of a lumiphoric material may be placed within the UV LED package that provides a visible light indicator in response to receiving UV emissions. In another example, the discrete region of a lumiphoric material may provide other nonvisible light, such as infrared, that may be detected by an infrared sensor that is separate from the UV LED package. For infrared embodiments, the infrared sensor may also be able to monitor and detect degradation of the UV LED during operation, thereby providing information to a user that is it time to replace the UV LED. In still further embodiments, the UV LED package may include a first discrete region of a first lumiphoric material that provides visible light and a second discrete region of a second lumiphoric material that provides nonvisible light, such as infrared. By providing such integrated and passive warning structures that do not require electrical connections, UV LED packages may be configured to provide indication of operation without added complexity.

In certain embodiments, the discrete region of lumiphoric material may be provided with an arrangement and/or quantity that does not significantly alter overall emissions from a UV LED package. In certain embodiments, overall emissions may be characterized in terms of purity, or color purity, where contributions from the lumiphoric material in the overall emissions are known to reduce color purity. As used here, the term "purity" or "color purity" has a well-known meaning with well-known calculation procedures to persons skilled in the art. In this regard, overall emissions from an LED package may be characterized in terms of chromaticity color coordinates on a CIE diagram that are on or within a spectral locus of the CIE diagram, where the spectral locus indicates monochromatic light. Color purity indicates how close a particular chromaticity color coordinate is to the spectral locus of the CIE diagram, where chromaticity color coordinates that are closer to the spectral locus indicate higher color purity than chromaticity color coordinates that are farther away from the spectral locus. In manner, a color purity of 100% would indicate a chromaticity color coordinate that is on the spectral locus. LEDs with high color purity may also be referred to as having high color saturation.

According to aspects of the present disclosure, UV LED packages are provided with arrangements and/or quantities of discrete lumiphoric materials such that overall emissions from the UV LED package are substantially provided by the one or more LED chips within the package. In this regard, contributions from the lumiphoric material to the overall emissions may be configured to be as small as possible while also providing visual and/or nonvisual indication that the UV LED is energized and emitting UV light. In certain embodiments, an LED package may include one or more LED chips that are configured to emit UV light having a first peak wavelength and a region of lumiphoric material that provides wavelength-converted light of a different second peak wavelength, and a purity of the LED package with respect to the first peak wavelength may be greater than 95%, or greater than 97%, or greater than 99.5%, or greater than 99.9%. In this manner, the lumiphoric material region may provide just enough of the second peak wavelength to serve as a warning indicator that UV emissions are being generated by the LED package. The second peak wavelength may be visible light or nonvisible light such as infrared. The above-described purity values are applicable to various LED packages described below that include support structures that may either be a submount with electrical traces or a lead frame structure. In certain embodiments, discrete lumiphoric material regions are provided in positions that are laterally spaced from mounting surfaces of an LED chip, thereby allowing a substantial portion of the LED light to escape without wavelength conversion for enhanced color purity. In certain embodiments, a discrete lumiphoric material region is provided with a small surface area within an LED package, such as no more that 15%, or no more than 10%, or no more than 5% of a surface area of an LED chip that is within the LED package. In other embodiments, the lumiphoric material region may occupy a larger area of the package, such as at least 50%, or at least 80% or more. In further embodiments, the lumiphoric material region may cover an entire surface of a submount that is outside of one or more LED chips. In such examples, a loading percentage of lumiphoric material within the lumiphoric material region may be low enough to not significantly alter the purity of overall emissions.

FIG. 1A is a cross-sectional view of an LED package 10 that includes an LED chip 12 configured to provide UV emissions and a lumiphoric material region 14 that is separately arranged from the LED chip 12 in order to provide wavelength-converted light to indicate when the LED chip 12 is electrically activated. In this regard, the lumiphoric material region 14 may be arranged within the LED package 10 and in the light path of the LED chip 12. The LED package 10 may include a first patterned trace 18 on a top face of a submount 16. As illustrated, the top face of the submount 16 corresponds with the side of the submount 16 on which the LED chip 12 is mounted. The first patterned trace 18 may include a stack of one or more metal layers 18-1 to 18-3 arranged sequentially from the submount 16. In a specific embodiment, the metal layer 18-1 may comprise copper (Cu) and/or alloys thereof, the metal layer 18-2 may comprise one or more of Ni, palladium (Pd), and/or alloys thereof, and the metal layer 18-3 may comprise Au or alloys thereof. As illustrated, a portion of the first patterned trace 18 may form a die attach pad with anode and cathode connections for the LED chip 12. A second patterned trace 20 may be arranged on the first patterned trace 18. In certain embodiments, the second patterned trace 20 may be selectively patterned over portions of the first patterned trace 18 that are adjacent one or more peripheral edges of the LED chip 12. The second patterned trace 20 may include any material that exhibits increased reflectivity for certain LED emissions compared with the first patterned trace 18, such as at least 60% reflectivity, or at least 80% reflectivity, or at least 90% reflectivity. By way of example, for UV-B and UV-C wavelengths, aluminum may provide at least 90% reflectivity while materials of the first patterned trace 18 may exhibit reflectivity below 40%. Depending on the application, the second patterned trace 20 may be omitted.

The submount 16 may include one or more electrically conductive vias 22 that extend through an entire thickness of the submount 16 to provide electrical connections between the LED chip 12 and portions of the first patterned trace 18 on the top face of the submount 16, and corresponding portions of a third patterned trace 24 that are provided on a bottom face of the submount 16. The third patterned trace 24 may be configured to receive external electrical connections for the LED package 10. Additionally, the third patterned trace 24 may be provided with a sufficient surface area across the bottom face of the submount 16 to improve thermal dissipation for the LED package 10. In certain embodiments, the third patterned trace 24 may include an arrangement of sequential metal layers 24-1 to 24-3 that are similar to the first patterned trace 18, where the metal layer 24-1 is similar to the metal layer 18-1, the metal layer 24-2 is similar to the metal layer 18-2, and the metal layer 24-3 is similar to the metal layer 18-3. In other embodiments, the third patterned trace 24 may include a structure that is different than the first patterned trace 18.

The LED package 10 may further include a cover structure 26 that is formed over the LED chip 12. The cover structure 26 may be attached to the first patterned trace 18 at or near a perimeter of the LED package 10. In certain embodiments, the cover structure 26 may be mounted to one or more portions of the first patterned trace 18 that are outside the second patterned trace 20. In other embodiments, the second patterned trace 20 could extend underneath portions of the cover structure 26 that are attached to the submount 16.

The cover structure 26 may form a cavity 28 or opening over the LED chip 12 and over the submount 16. In certain embodiments, the cavity 28 may be filled with air and/or nitrogen. In certain embodiments, the cavity 28 may be under a vacuum relative to a surrounding atmosphere, depending on how the cover structure 26 is attached. The cover structure 26 may even form a hermetic seal for the LED package 10. In certain embodiments, the cover structure 26 may form a lens with a domed or hemispherical shape for directing light emissions from the LED chip 12. In certain embodiments, the lens may comprise many different shapes depending on the desired shape of the light output. Suitable shapes include hemispheric, ellipsoid, ellipsoid bullet, cubic, flat, hex-shaped and square. In certain embodiments, a suitable shape includes both curved and planar surfaces, such as a hemispheric or curved top portion with planar side surfaces. As previously described, the cover structure 26 may be configured to receive UV emissions from the LED chip 12 and may therefore include at least one of glass, quartz, and/or ceramic materials that provide reduced breakdown from exposure to UV emissions while also being able to be attached or otherwise bonded to the submount 16 and seal the underlying LED chip 12.

In FIG. 1A, the lumiphoric material region 14 is arranged on a portion of the first patterned trace 18 and/or submount 16 that is laterally spaced from the LED chip 12, wherein the lateral spacing is arranged in a direction that is parallel to a surface of the first patterned trace 18 and/or submount 16 on which the LED chip 12 is mounted. This may allow a substantial portion of light emitted from the LED chip 12 to escape the LED package 10 without wavelength conversion, thereby providing high color purity of overall emissions relative to the peak wavelength of light provided by the LED chip 12. In certain embodiments, the lumiphoric material region 14 may also be formed on a portion of the second patterned trace 20, when present. In this arrangement, the lumiphoric material region 14 may be arranged within the cavity 28 in a position that receives a portion of laterally emitted light from the LED chip 12. Accordingly, the lumiphoric material region 14 may not be arranged directly between a top surface 12' of the LED chip 12 and an emission direction of the LED package 10 that corresponds with a focal point or top surface of the cover structure 26. Stated differently, the lumiphoric material region 14 may not be arranged between the top surface 12' of the LED chip 12 and the cover structure 26. In this manner, a top surface 14' of the lumiphoric material region 14 may be provided at a height above the submount 14 that is less than a height of the LED chip 12 above the submount 14. While the first patterned trace 18 is illustrated with four segments on the submount 16 and with gaps on either side of the LED chip 12, the first patterned trace 18 may have other configurations without deviating from the principles disclosed. For example, the first patterned trace 18 may have two segments on the submount 16 that correspond with anode and cathode connections for the LED chip 12, where each of the two segments is continuous from the LED chip 12 toward perimeter edges of the submount 16. In such a configuration, the one or more vias 22 may be arranged closer to a perimeter edge of the submount 16 and the lumiphoric material region 14 may be arranged in a position that is vertically aligned with at least one of the vias 22, thereby masking the appearance of the particular via 22.

Figure 1B:
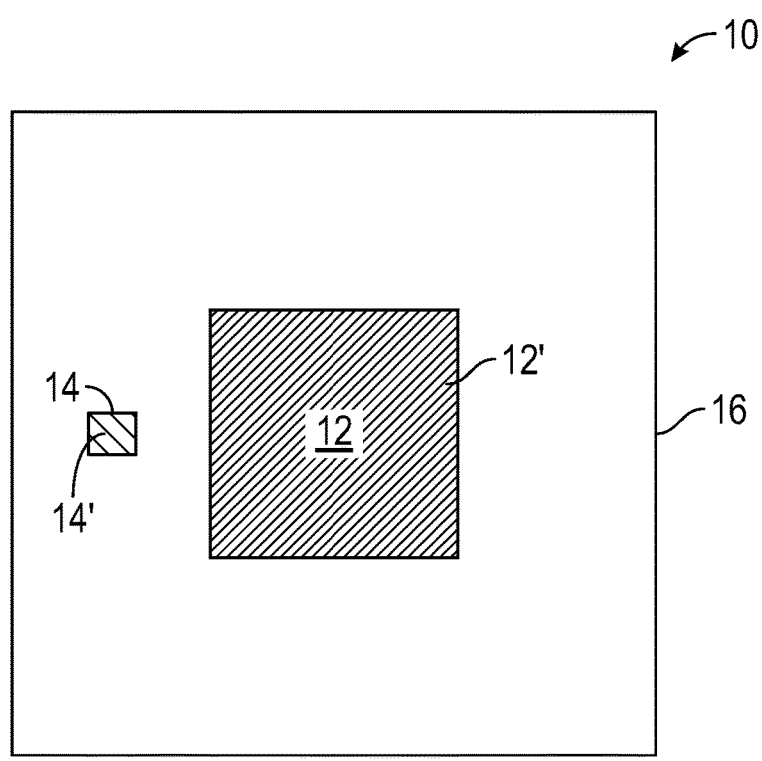
FIG. 1B is a generalized top view of a portion of the LED package of FIG. 1A to illustrate a layout of the lumiphoric material region compared with the LED chip.

FIG. 1B is a generalized top view of a portion of the LED package 10 of FIG. 1A to illustrate a layout of the lumiphoric material region 14 compared with the LED chip 12. For illustrative purposes, only the location of the LED chip 12 and the lumiphoric material region 14 on the submount 16 are provided. The lumiphoric material region 14 may be a discrete region that is laterally spaced from the LED chip 12 across a surface of the submount 16 on which the LED chip 12 is mounted. As shown, the lumiphoric material region 14 may be patterned to have a total area that is substantially smaller than an area of the LED chip 12. For example, from the perspective of the top view of FIG. 1B, the total area of the top surface 14' of the lumiphoric material region 14 may be no more that 15%, or no more than 10%, or no more than 5% of an area of the top surface 12' of the LED chip 12 as measured across the top surface of the submount 16. In this manner, the color purity of the LED package 10 may be high relative to a peak emission wavelength of the LED chip 12. For UV applications where the LED chip 12 does not emit visible light, the lumiphoric material region 14 may be configured to receive UV light and emit visible light, such as 380 nm to 700 nm, or 400 nm to 700 nm. In this manner, a user that is proximate the LED package 10 during operation may have a visual indicator that the LED chip 12 is electrically activated and emitting UV light.

In a particular example, the LED chip 12 may be configured to emit UV-C emissions and the lumiphoric material region 14 may be configured to provide visible light emissions such as a peak wavelength in a range from 400 nm to 440 nm. Such visible light wavelength ranges may be selected to provide a visible color that is unique from other more common wavelength ranges of blue, green, and/or red light in order to provide a unique warning color for someone that may not be familiar with the warning features of the LED package 10. In this regard, a person that is proximate the energized LED package 10 may be more inclined to not mistake the warning emissions as standard emissions from a typical visible light LED package. In other embodiments, the lumiphoric material region 14 may be configured to provide a peak wavelength that is anywhere in the visible spectrum without deviating from the principles disclosed.

In certain embodiments, the lumiphoric material region 14 may be formed directly on one or more surfaces of the submount 16 by way of a selective deposition process, such as spray coating through a patterned mask, a stencil process, or other types of lumiphoric material deposition. In other embodiments, the lumiphoric material region 14 may be provided as a pre-formed structure that is subsequently attached to the submount 16 with an adhesive, such as silicone or with eutectic attach materials. For UV applications, exposure to UV emissions may break bonds of conventional binder materials (e.g., silicone) that typically host lumiphoric materials such as phosphors. In this regard, the lumiphoric material region 14 may be configured with a high loading percentage of lumiphoric material, such as phosphor particles, relative to any binder material in order to reduce UV induced degradation of the binder. For example, the lumiphoric material region 14 may include a ratio of lumiphoric material such as phosphor particles to binder material that is at least 5 to 1, and as high as 15 to 1. In other embodiments, the lumiphoric material region 14 may be formed from a sintered ceramic that does not include conventional binder materials. For example, the lumiphoric material region 14 may be formed from a small particle Ag paste that is mixed with lumiphoric material and epoxy. After sintering, the epoxy may burn off leaving a mixed lumiphoric material and Ag hardened structure that forms the lumiphoric material region 14 with reduced susceptibility to UV induced degradation. In still further embodiments, the lumiphoric material region 14 may be formed from a phosphor-in-glass material or a ceramic phosphor plate. For phosphor-in-glass embodiments, the glass may embody any amorphous and/or non-crystalline oxide material. The sintered ceramic, phosphor-in-glass, and ceramic phosphor plate arrangements may be advantageous for forming the lumiphoric material region 14 as a pre-formed structure.

In certain embodiments, the patterned nature of lumiphoric material regions according to the present disclosure may allow the lumiphoric material regions to also serve as indicators that convey other information beyond just electrical activation. For example, patterned lumiphoric material regions according to the present disclosure may also provide polarity information to assist with correct mounting of LED packages and/or as logo or symbols that serve to identify a particular product and/or manufacturer.

Figure 2:
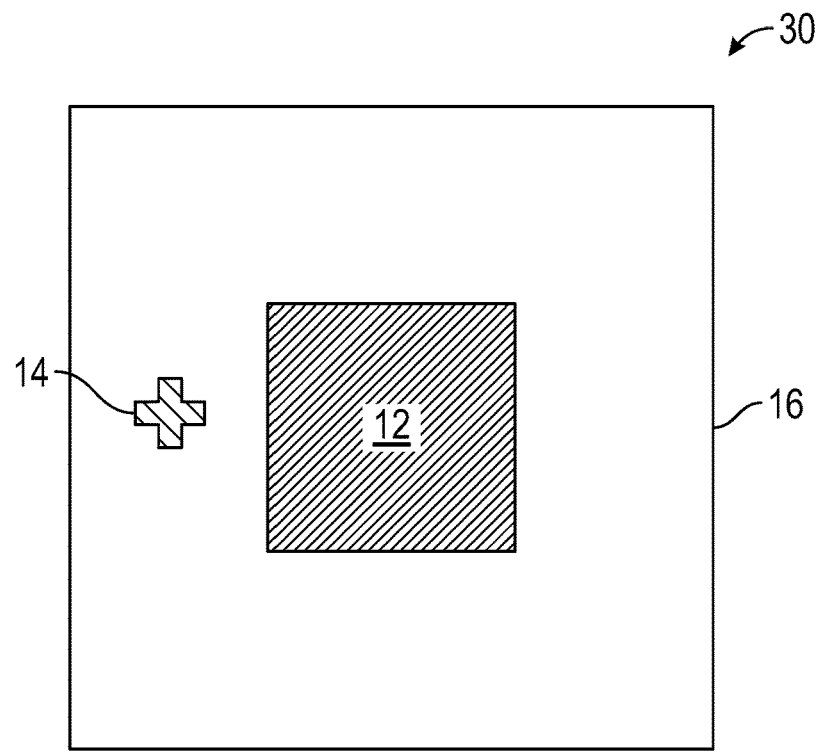
FIG. 2 is a generalized top view of a portion of an LED package that is similar to the LED package of FIG. 1B but where the lumiphoric material region also forms a polarity indicator.

FIG. 2 is a generalized top view of a portion of an LED package 30 that is similar to the LED package 10 of FIG. 1B but where the lumiphoric material region 14 also forms a polarity indicator. As illustrated, the lumiphoric material region 14 may form a plus sign on a surface of the submount 16, thereby indicating which side of the LED package 30 corresponds with an anode connection. In this manner, the lumiphoric material region 14 may provide both warning emissions of light to indicate electrical activation of the LED chip 12 and the polarity indicator for the LED package 30. While a plus sign is illustrated, the lumiphoric material region 14 may be patterned in any number of shapes, including a minus sign to indicate a cathode orientation. In still further embodiments, the presence of the lumiphoric material region 14 on a particular side of the chip 12 may be used to indicate polarity, regardless of the actual shape. This would include the embodiments illustrated in FIG. 1B where the lumiphoric material region 14 forms a single square adjacent a single side of the LED chip 12.

Figure 3:
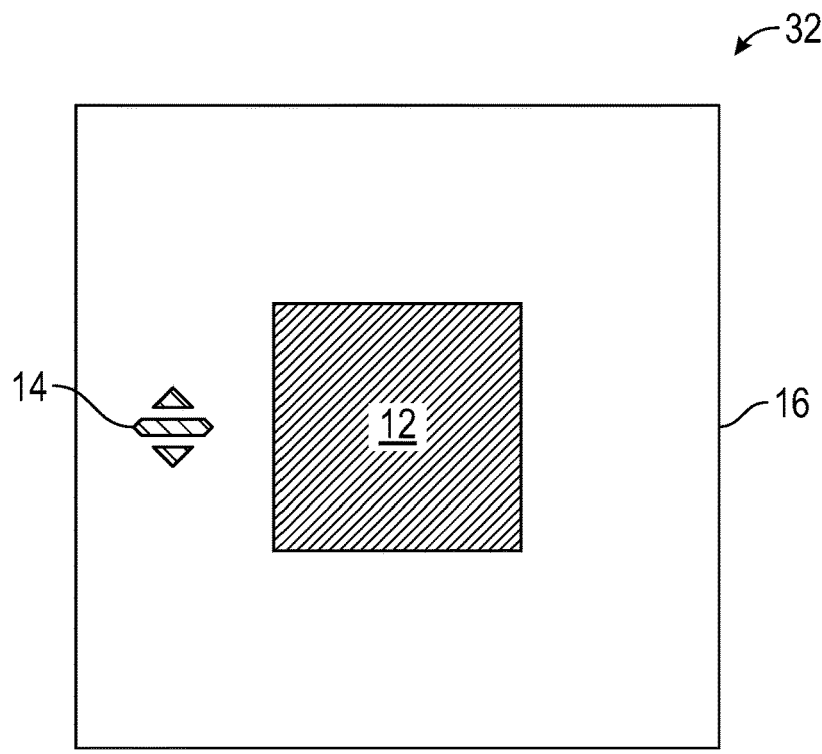
FIG. 3 is a generalized top view of a portion of an LED package that is similar to the LED package of FIG. 2 but where the lumiphoric material region also forms a logo or symbol that may identify a particular product or manufacturer.

FIG. 3 is a generalized top view of a portion of an LED package 32 that is similar to the LED package 30 of FIG. 2 but where the lumiphoric material region 14 also forms a logo or symbol that may identify a particular product or manufacturer. In this manner, the lumiphoric material region 14 may provide both warning emissions of light to indicate electrical activation of the LED chip 12 and convey information related to the LED package 32, including but not limited to identification of the manufacturer. As illustrated, the shape of the lumiphoric material region 14 may be formed by a grouping of discontinuous portions of the lumiphoric material region 14 that are tightly spaced on the submount 16. In other embodiments, the shape of the lumiphoric material region 14 may include one or more alphanumeric characters or symbols that identity other information about the LED package 32, including but not limited to identification of the wavelength of light emitting by the LED chip 12. For example, the symbols may be arranged to represent UV-A, UV-B, or UV-C, among others.

FIGS. 4A to 4C illustrate various fabrication steps for forming multiple lumiphoric material regions 14 as a pre-formed structure. FIG. 4A is a top view of a lumiphoric material sheet 34 that may be subdivided into individual lumiphoric material regions 14. FIG. 4B is a top view of an individual lumiphoric material region 14 that is singulated from the lumiphoric material sheet 34 of FIG. 4A. FIG. 4C is a cross-sectional view of the lumiphoric material region 14 of FIG. 4B taken along the sectional line 4C-4C of FIG. 4B. The lumiphoric material sheet 34 of FIG. 4A may embody any of a phosphor-in-glass sheet, a sintered ceramic sheet or a ceramic phosphor plate. Various singulation lines 36 are illustrated as superimposed dashed lines along the lumiphoric material sheet 34. In this manner, individual lumiphoric material regions 14 may be defined within boundaries of the intersecting singulation lines 36. The lumiphoric material regions 14 may be separated along the singulation lines 36 by one or more of a cutting process and a punch process, among other dicing techniques. In certain embodiments, patterns may be formed within each lumiphoric material region 14 by forming various nonplanar features 38 across the lumiphoric material sheet 34. For example, the nonplanar features 38 may embody trenches that are laser etched through a thickness of the lumiphoric material sheet 34 that may then be present in each individual lumiphoric material region 14 as illustrated in FIG. 4B. In other embodiments, the nonplanar features 38, including trenches, may be formed with a mold as the lumiphoric material sheet 34 is fired or sintered. As best illustrated in FIG. 4C, the one or more nonplanar features 38 may extend only through a partial thickness of the lumiphoric material region 14 in certain embodiments.

Figure 5A:
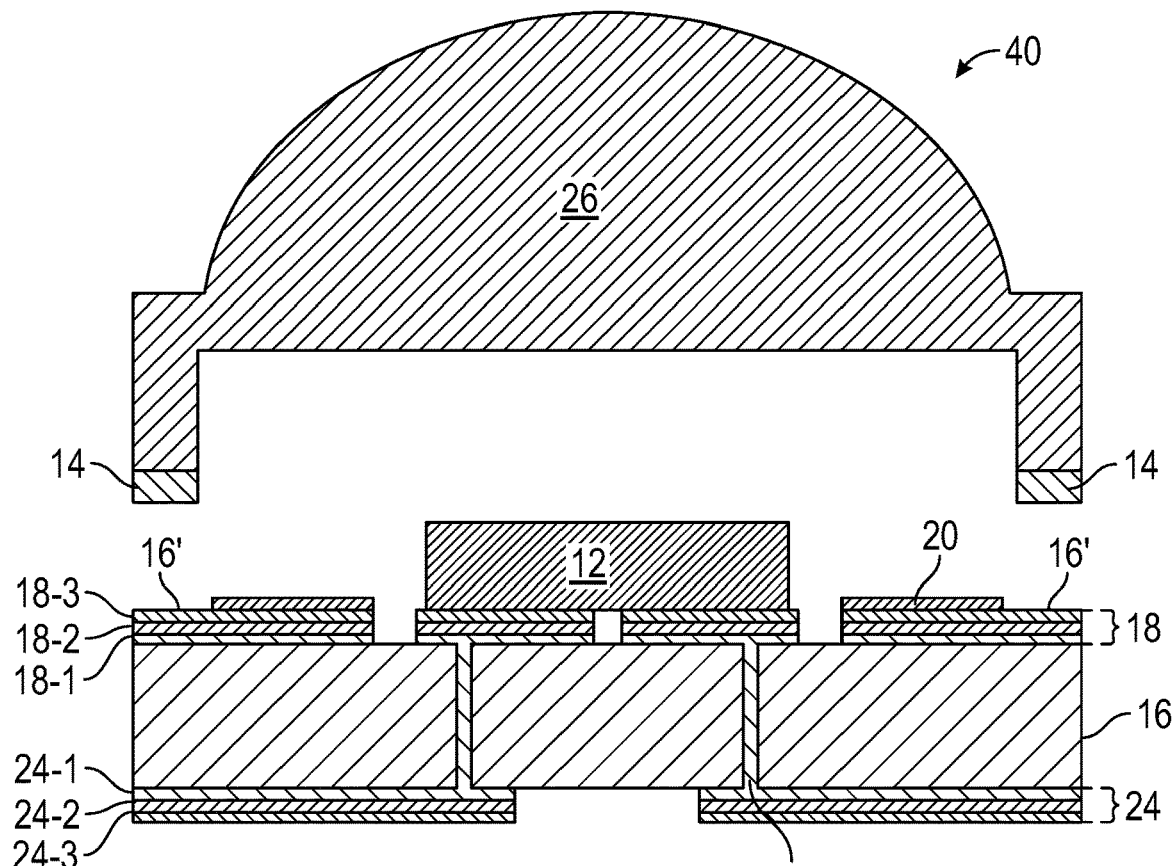
FIG. 5A is a partially exploded cross-sectional view of an LED package that is similar to the LED package of FIG. 1A but includes an arrangement where the lumiphoric material region is integrated with or formed on the cover structure.
Figure 5B:
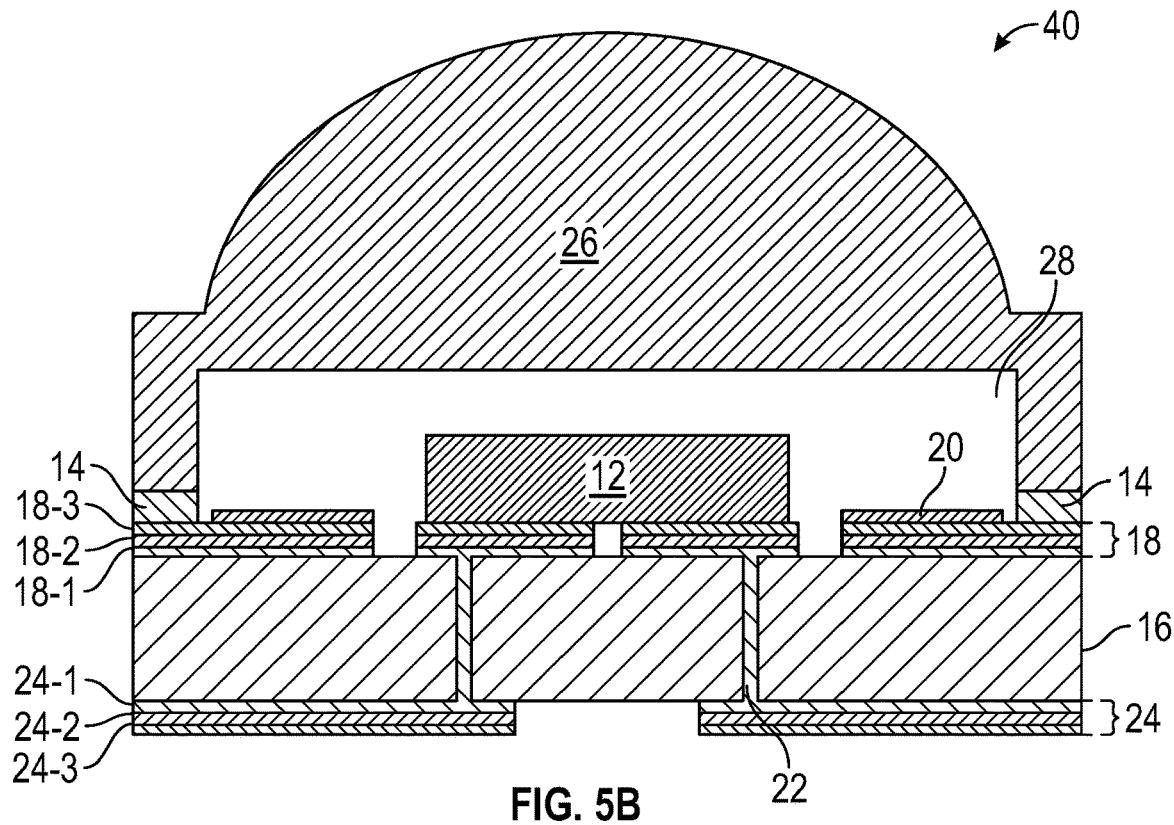
FIG. 5B is an assembled cross-sectional view of the LED package of FIG. 5A where the cover structure and the lumiphoric material region are attached to the submount.

FIG. 5A is a partially exploded cross-sectional view of an LED package 40 that is similar to the LED package 10 of FIG. 1A but includes an arrangement where the lumiphoric material region 14 is integrated with or formed on the cover structure 26. FIG. 5B is an assembled cross-sectional view of the LED package 40 of FIG. 5A where the cover structure 26 and the lumiphoric material region 14 are attached to the submount 16. As best illustrated in FIG. 5A, the lumiphoric material region 14 is arranged on the cover structure 26 in an integral manner before it is attached to the submount 16. In certain embodiments, the lumiphoric material region 14 may be arranged on one or more portions of the cover structure 26 that correspond with attachment surfaces 16' where the cover structure 26 will be physically attached to the submount 16. In this manner, the lumiphoric material region 14 may be arranged at or near an attachment interface between the cover structure 26 and the submount 16. In certain embodiments, the lumiphoric material region 14 may be loaded or otherwise incorporated within an adhesive that is used to attach the cover structure 26 to the submount 16. Exemplary adhesives include one or more of Ag, Au, tin (Sn), Au—Sn and various alloys thereof. As illustrated in FIG. 5B, when assembled, the lumiphoric material region 14 may form a discrete region that is laterally spaced from the LED chip 12 in a direction that is parallel to a surface of the submount 16 on which the LED chip 12 is mounted.

Figure 5C:
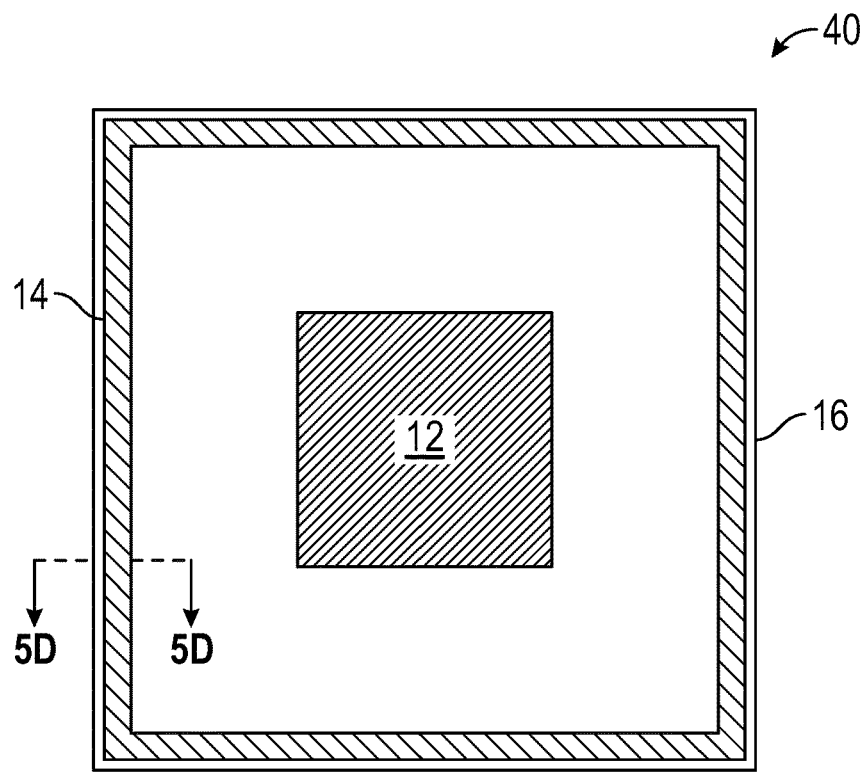
FIG. 5C is a generalized top view of a portion of the LED package of FIG. 5B to illustrate a layout of the lumiphoric material region compared with the LED chip.

FIG. 5C is a generalized top view of a portion of the LED package 40 of FIG. 5B to illustrate a layout of the lumiphoric material region 14 compared with the LED chip 12. As illustrated, by arranging the lumiphoric material region 14 where the cover structure 26 of FIG. 5B is attached, the lumiphoric material region 14 may form a continuous shape that laterally surrounds the LED chip 12. In this arrangement, the lumiphoric material region 14 may be arranged closer to peripheral edges of the submount 16 than to the LED chip 12, thereby providing suitable warning emissions without substantially impacting color purity of the LED package 40. In certain embodiments, the lumiphoric material region 14 may be arranged in a parallel manner with peripheral edges of the submount 16 to form a rectangular shape. In other embodiments, the lumiphoric material region 14 may form other shapes that laterally surround the LED chip 12, including circular or polygonal, depending on a corresponding shape of one or more of the cover structure 26 of FIG. 5B and the submount 16. A concentration of lumiphoric material within the lumiphoric material region 14 may be uniformly distributed in certain embodiments, while in others, a nonuniform distribution may be provided as described below for the example of FIG. 5D.

Figure 5D:
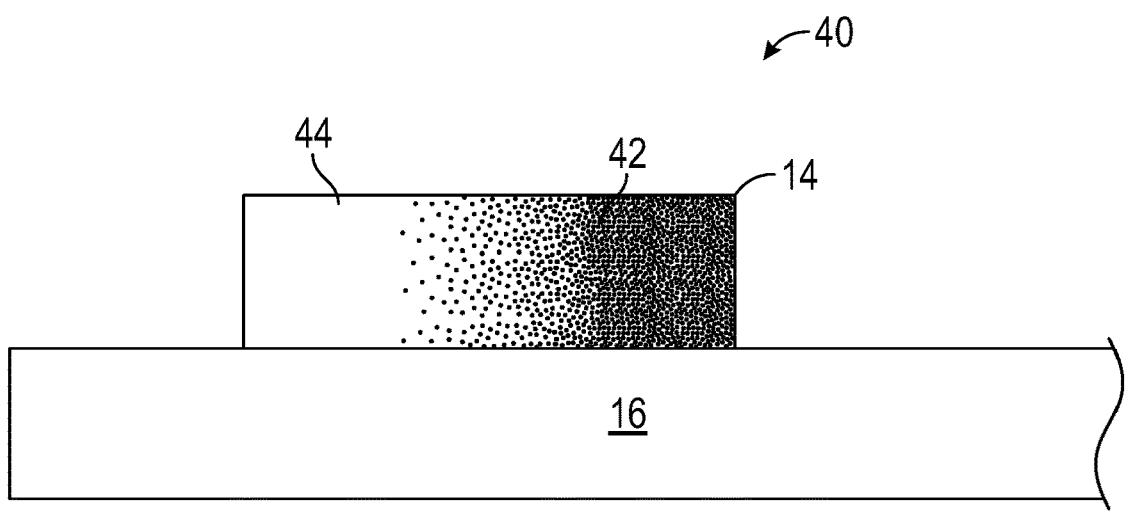
FIG. 5D is a cross-sectional view of a particular configuration of the lumiphoric material region in the LED package of FIG. 5C taken along the sectional line 5D-5D of FIG. 5C.

FIG. 5D is a cross-sectional view of a particular configuration of the lumiphoric material region 14 in the LED package 40 of FIG. 5C taken along the sectional line 5D-5D of FIG. 5C. In certain embodiments, the lumiphoric material region 14 may include a loading of lumiphoric material 42 within a binder 44 that is nonuniform or graded in a direction toward the LED chip 12 of FIG. 5C (e.g., in a direction that is parallel to the support structure or submount 16). As illustrated, a concentration of the lumiphoric material 42 may be highest along portions of the lumiphoric material region 14 that are closest to the LED chip of FIG. 5C and a concentration of the binder 44 may be higher along portions of the lumiphoric material region 14 that are farther away from the LED chip 12 of FIG. 5C. In this manner, higher concentrations of the binder 44, which may be more susceptible to degradation with exposure to UV emissions, may be arranged farther away from such emissions. The graded arrangement of the lumiphoric material region 14 may be provided by a stenciling process or the like on portions of the cover structure. The embodiments illustrated in FIG. 5D are a particular arrangement for the LED package 40 of FIGS. 5A to 5C, and not meant to be the only arrangement. As described above, other embodiments for the lumiphoric material region 14 illustrated in FIGS. 5A to 5C include uniform distributions of the lumiphoric material 42 within the lumiphoric material region 14.

Figure 6:
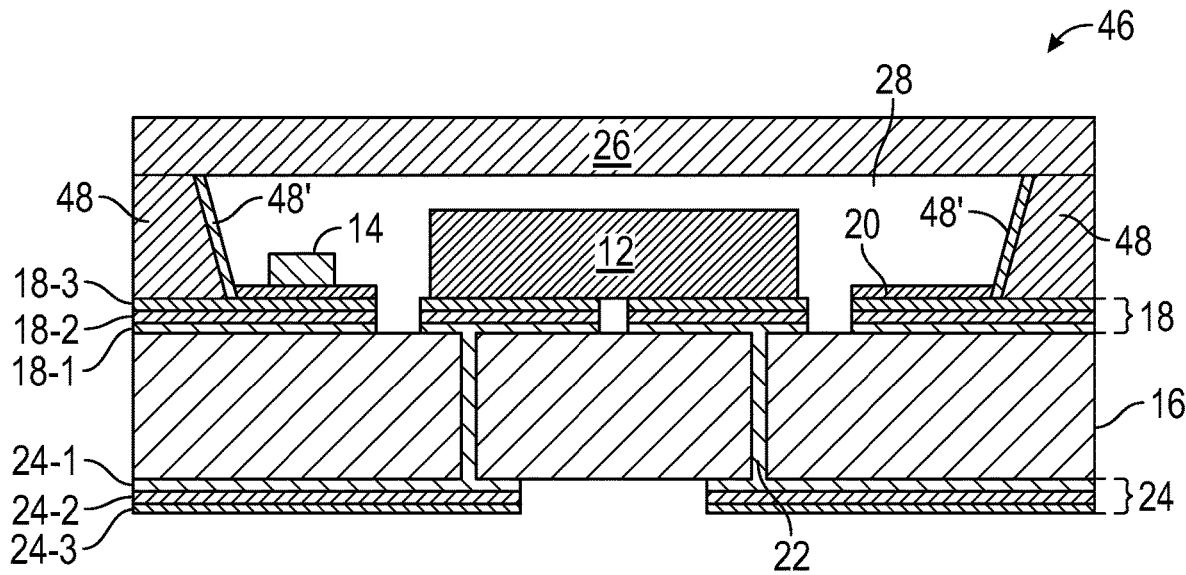
FIG. 6 is a cross-sectional view of an LED package that is similar to the LED package of FIG. 1A but where the lumiphoric material region is arranged proximate a reflector structure that is arranged between the cover structure and the submount.

FIG. 6 is a cross-sectional view of an LED package 46 that is similar to the LED package 10 of FIG. 1A but where the lumiphoric material region 14 is arranged proximate a reflector structure 48 that is arranged between the cover structure 26 and the submount 16. In certain embodiments, the reflector structure 48 is a separate element that may be mounted or otherwise attached to one or more of the first patterned trace 18 and the submount 16. As illustrated, the cover structure 26 may be attached to the reflector structure 48, and the reflector structure 48 (and cover structure 26) may be attached to the submount 16 around a periphery of the LED chip 12. While the cover structure 26 is illustrated as planar in FIG. 6, the cover structure 26 may form a lens with a domed or hemispherical shape for directing light emissions from the LED chip 12. In certain embodiments, the lens may comprise many different shapes depending on the desired shape of light output from the LED package 46. Suitable shapes include hemispheric, ellipsoid, ellipsoid bullet, cubic, flat, hex-shaped and square. In certain embodiments, a suitable shape includes both curved and planar surfaces, such as a hemispheric or curved top portion with planar side surfaces.

The reflector structure 48 may comprise internal sidewalls 48' that define lateral boundaries of the cavity 28. In certain embodiments, the sidewalls 48' may be angled with respect to the submount 16 to redirect laterally emitted light from the LED chip 12 through the cover structure 26 in a desired emission direction for the LED package 46. In other embodiments, the sidewalls 48' may form vertical sidewalls that are substantially perpendicular to the submount 16 while still redirecting lateral light emissions from the LED chip 12. The reflector structure 48 may include a material with a sufficient coefficient of thermal expansion (CTE) relative to other portions of the LED package 46. In certain embodiments, the reflector structure 48 comprises silicon with a metal coating, for example aluminum or alloys thereof, on the sidewalls 48'. In other embodiments, the entire reflector structure 48 may comprise a metal, such as aluminum or alloys thereof. In still other embodiments, the reflector structure 48 may comprise a ceramic, such as one or more of aluminum oxide ($Al_2O_3$), zirconium dioxide ($ZrO_2$), silicon dioxide ($SiO_2$), and aluminum (AlN). For embodiments where the reflector structure 48 comprises a ceramic material, the sidewalls 48' may be coated with a metal as described above for added reflectivity.

As illustrated in FIG. 6, the lumiphoric material region 14 is arranged on at least one of the second patterned trace 20 and the first patterned trace 18 in a location that is within the cavity 28. In this regard, the lumiphoric material region 14 is within a portion of a light path of the LED chip 12 for providing wavelength-converted emissions as indication that the LED chip 12 is electrically energized. As further illustrated in FIG. 6, the lumiphoric material region 14 is not arranged between the LED chip 12 and the cover structure 26, thereby providing such wavelength-converted emissions without significant impact on color purity. As with other embodiments, such an arrangement provides the lumiphoric material region 14 as a discrete region that is laterally separated from the LED chip 12 in a direction that is parallel to a surface of the submount 16 on which the LED chip 12 is mounted.

Figure 7:
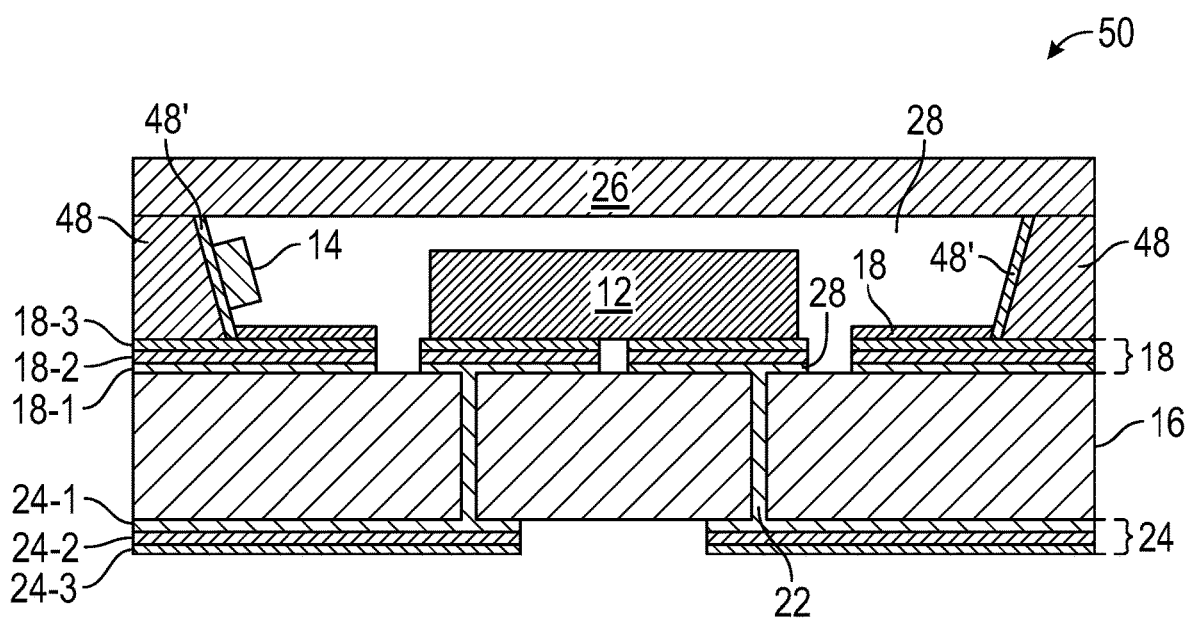
FIG. 7 is a cross-sectional view of an LED package that is similar to the LED package of FIG. 6 but where the lumiphoric material region is arranged on the reflector structure.

FIG. 7 is a cross-sectional view of an LED package 50 that is similar to the LED package 46 of FIG. 6 but where the lumiphoric material region 14 is arranged on the reflector structure 48. As illustrated, the lumiphoric material region 14 may be arranged on one or more of the sidewalls 48' of the reflector structure 48. In this arrangement, a portion of laterally emitted light from the LED chip 12 that is reflected by the sidewalls 48' may be subject to wavelength conversion to serve as indication that the LED chip 12 is electrically energized. As with other embodiments, the lumiphoric material region 14 may be arranged to provide such wavelength-converted emissions without significant impact on color purity. Additionally, such an arrangement provides the lumiphoric material region 14 as a discrete region that is laterally separated from the LED chip 12 in a direction that is parallel to a surface of the submount 16 on which the LED chip 12 is mounted.

Figure 8:
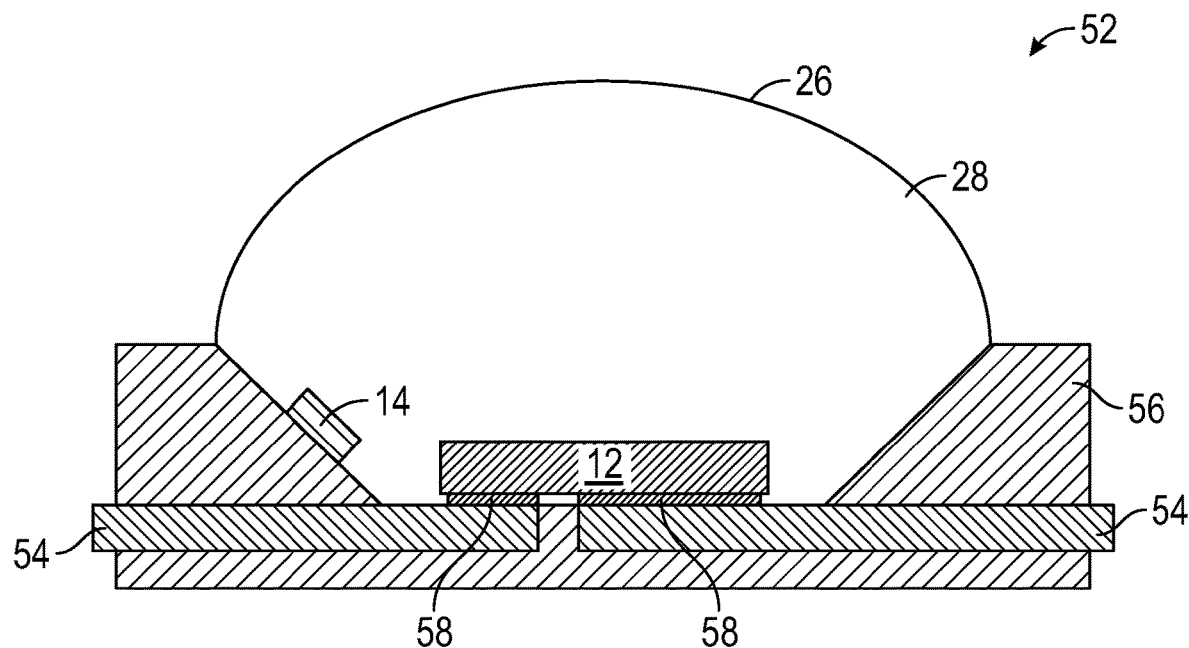
FIG. 8 is a cross-sectional view of an LED package that is similar to the LED package of FIG. 1A except the LED package includes an arrangement of the lumiphoric material region relative to a lead frame structure.

FIG. 8 is a cross-sectional view of an LED package 52 that is similar to the LED package 10 of FIG. 1A except the LED package 52 includes an arrangement of the lumiphoric material region 14 relative to a lead frame structure. The lead frame structure may include at least a pair of leads 54 and an insulated housing 56, wherein the leads 54 are electrically isolated from one another and mechanically supported by the insulated housing 56. Each lead 54 is electrically coupled to a respective contact pad 58 (i.e., anode or cathode) of the LED chip 12. In FIG. 8, the LED chip 12 is flip-chip connected to the leads 54. In other embodiments, one or more wire bonds may be used to electrically connect the LED chip 12 to at least one of the leads 54. The leads 54 may be formed of a metal, such as copper, copper alloys, or other conductive metals. The leads 54 may initially be part of a larger lead frame structure that is singulated during manufacturing of LED packages. The insulating housing 56 may be formed to surround portions of the leads 54 before singulation. In certain embodiments, the insulating housing 56 may form reflective sidewalls of a cup or a recess in the LED package 52 where the LED chip 12 is mounted. As illustrated, portions of the leads 54 may be arranged to protrude or otherwise be accessible outside of the insulating housing 56 to provide external electrical connections for the LED package 52. The cover structure 26 may form a lens over the lead frame structure and may further form the cavity 28 as previously described, particularly for UV applications. As illustrated, the lumiphoric material region 14 may be arranged on a sidewall of the insulating housing 56 in a manner similar to the LED package 50 of FIG. 7. In this manner, the lumiphoric material region 14 may form a discrete region that is laterally spaced from the LED chip 12 across a surface of the lead frame structure and in a direction that is parallel to a surface of the lead frame structure (e.g., at least one of the leads 54) on which the LED chip 12 is mounted.

Figure 9:
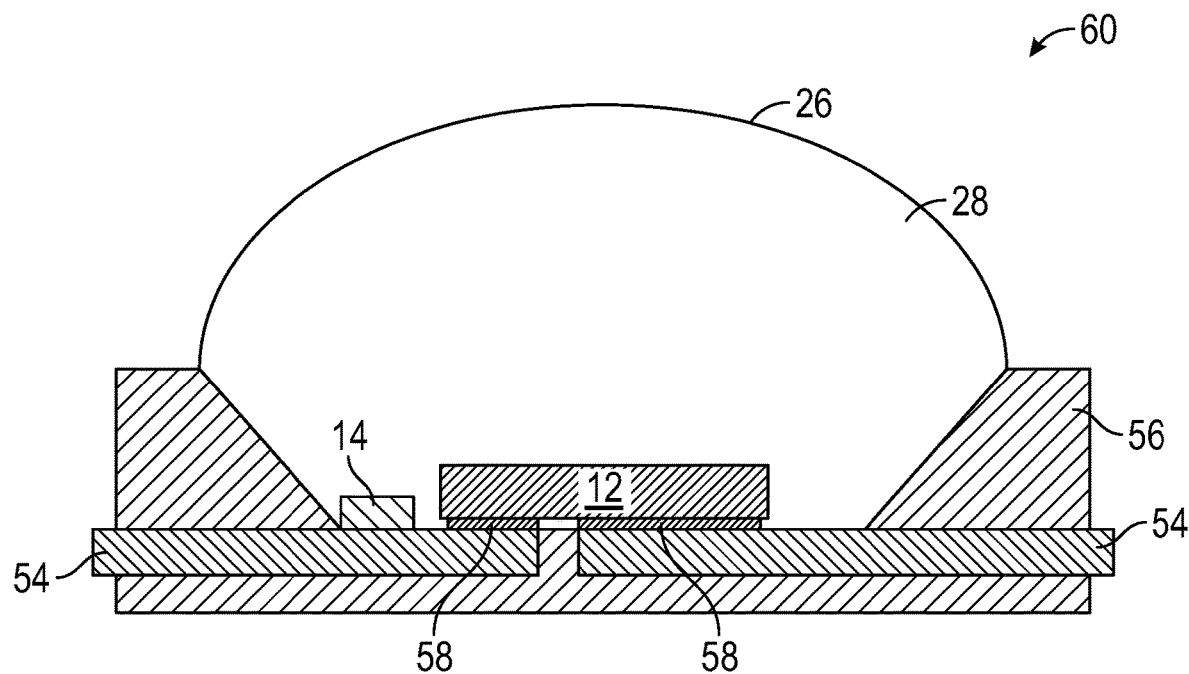
FIG. 9 is a cross-sectional view of an LED package that is similar to the LED package of FIG. 8 except the lumiphoric material region is arranged on one of the leads of the lead frame structure.

FIG. 9 is a cross-sectional view of an LED package 60 that is similar to the LED package 52 of FIG. 8 except the lumiphoric material region 14 is arranged on one of the leads 54 of the lead frame structure. As illustrated, the lumiphoric material region 14 may be arranged on a surface of at least one of the leads 54 that is adjacent to the insulating housing 56. In certain embodiments, the surface of the lead 54 on which the lumiphoric material region 14 resides may be coplanar with an interface between the contact pad 58 of the LED chip 12 and the lead 54. In this arrangement, the lumiphoric material region 14 may be arranged with a lateral spacing from sidewalls of the LED chip 12 for providing wavelength converted light as indication that the LED chip 12 is electrically energized. Accordingly, the lumiphoric material region 14 may form a discrete region that is laterally spaced from the LED chip 12 in a direction that is parallel to a surface of the lead frame structure (e.g., at least one of the leads 54) on which the LED chip 12 is mounted.

As previously described, lumiphoric material regions according to the present disclosure may also be configured to provide nonvisible wavelength-converted emissions in response to receiving UV light. For example, discrete lumiphoric material regions may be configured to provide infrared emissions that may be detected by an infrared sensor that is separate from the UV LED package. For infrared embodiments, the external infrared sensor may also be able to monitor and detect degradation of the UV LED during operation, thereby providing information to a user that is it time to replace the UV LED. In certain embodiments, infrared light may include a peak wavelength in a range from 700 nm to 1 mm, or in various subranges such as a range from 700 nm to 1400 nm, or a range from 700 nm to 2500 nm, or in a range from 700 nm to 4000 nm.

Figure 10:
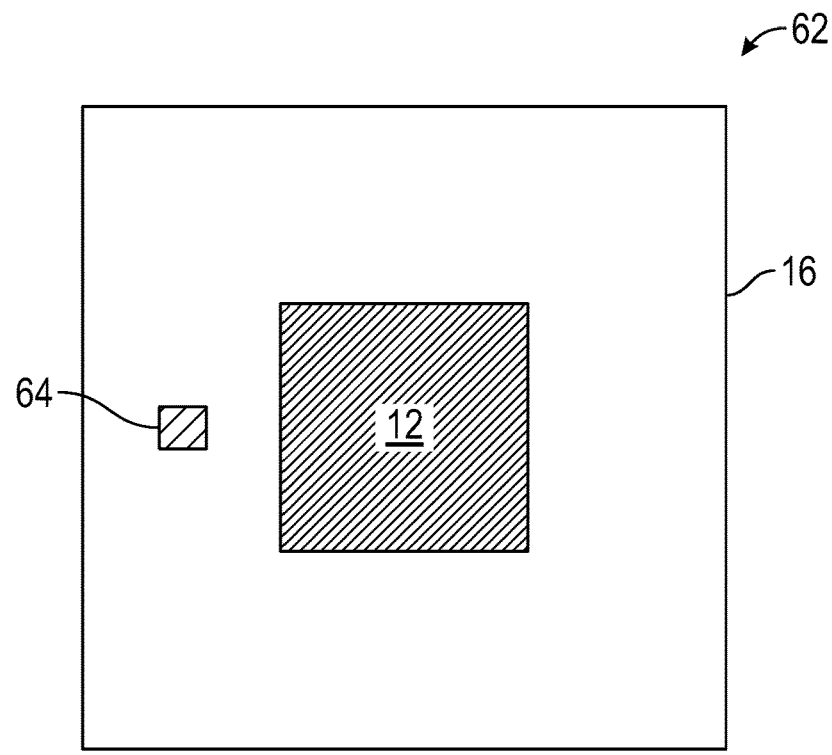
FIG. 10 is a generalized top view of a portion of an LED package that is similar to the LED package of FIG. 1B but includes a lumiphoric material region that is configured to provide nonvisible wavelength-converted light in response to receiving UV light from the LED chip.

FIG. 10 is a generalized top view of a portion of an LED package 62 that is similar to the LED package 10 of FIG. 1B but includes a lumiphoric material region 64 that is configured to provide nonvisible wavelength-converted light in response to receiving UV light from the LED chip 12. The lumiphoric material region 64 may be formed according to any of the above-described manners for the lumiphoric material region 14 of FIG. 1B, just with lumiphoric materials that emit nonvisible light such as infrared when UV light is received. Additionally, the lumiphoric material region 64 may be arranged with an area and/or concentration that does not significantly impact a color purity of the LED package 62 relative to the peak wavelength provided by the LED chip 12. The lumiphoric material region 64 as described for FIG. 10 may further be provided with any of the arrangements described above for FIGS. 2 to 4C. Additionally, the lumiphoric material region 64 may be provided in any of the LED packages described above for FIGS. 5A-9 or in any of the LED packages described below for FIGS. 12-14.

Figure 11:
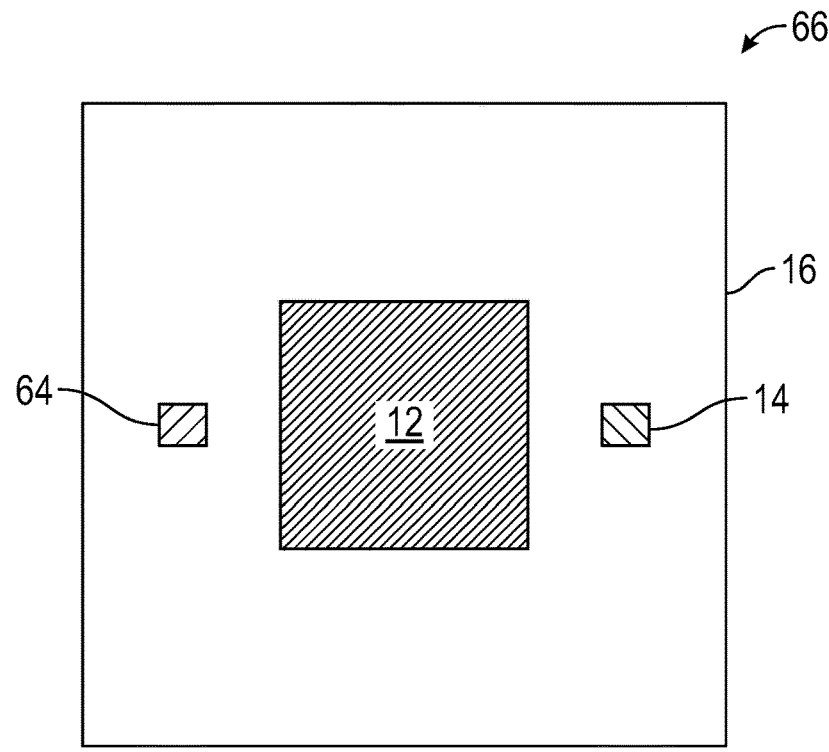
FIG. 11 is a generalized top view of a portion of an LED package that is similar to the LED package of FIG. 10 but includes both the lumiphoric material region of FIG. 10 and the lumiphoric material region of FIG. 1B.

FIG. 11 is a generalized top view of a portion of an LED package 66 that is similar to the LED package 62 of FIG. 10 but includes both the lumiphoric material region 64 of FIG. 10 and the lumiphoric material region 14 of FIG. 1B. In this regard, when the LED chip 12 is energized to provide UV emissions, the LED package 66 may provide both visible wavelength-converted emissions from the lumiphoric material region 14 and nonvisible wavelength-converted emissions from the lumiphoric material region 64. The visible wavelength-converted emissions may provide a visual warning to anyone that is proximate the LED package 66 while the nonvisible wavelength-converted emissions may provide various information to remote sensors, such as infrared sensors. The lumiphoric material regions 14 and 64 may further be provided with any of the arrangements described above for FIGS. 2 to 4C. Additionally, the lumiphoric material regions 14 and 64 may both be provided in any of the LED packages described above for FIGS. 5A-9 or in any of the LED packages described below for FIGS. 12-14.

Figure 12:
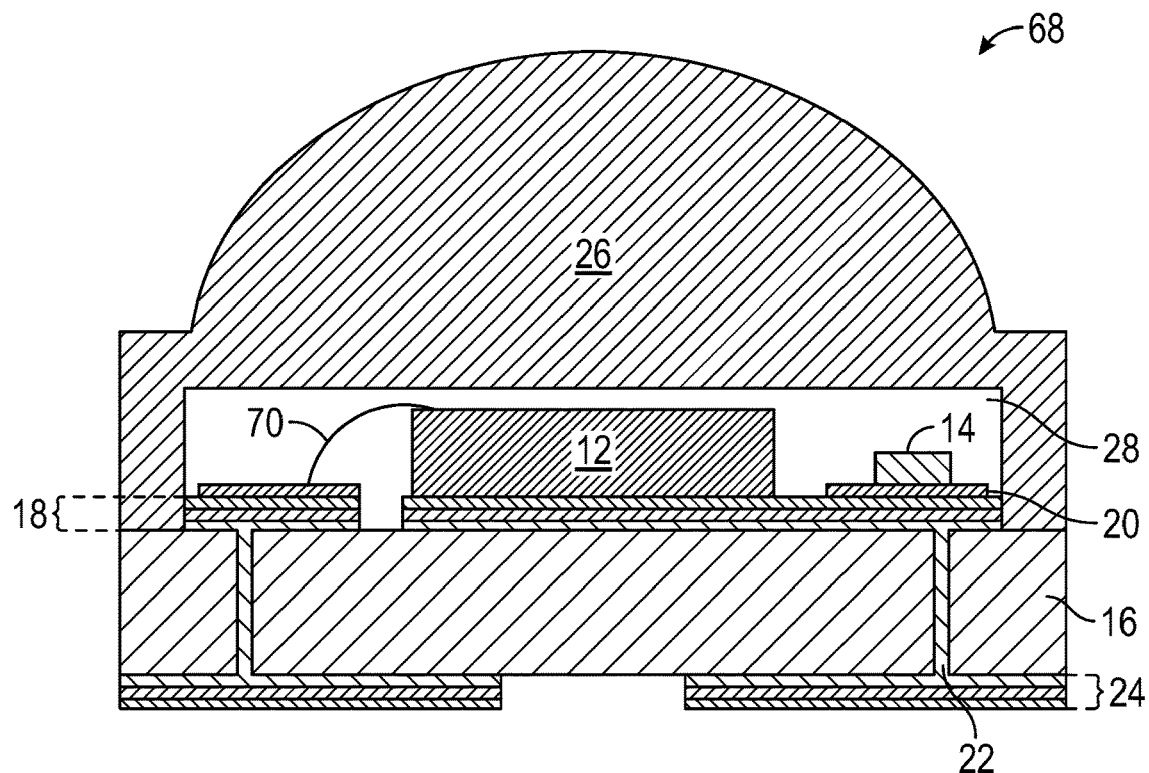
FIG. 12 is a cross-sectional view of an LED package that is similar to the LED package of FIG. 1A except the LED chip includes a vertical geometry.

FIG. 12 is a cross-sectional view of an LED package 68 that is similar to the LED package 10 of FIG. 1A except the LED chip 12 includes a vertical geometry. In this manner, a wire bond 70 may be electrically coupled to at least a portion of the second patterned trace 20 and/or the first patterned trace 18 to provide an anode or a cathode connection for the LED chip 12. An interface between the LED chip 12 and a different portion of the second patterned trace 20 and/or the first patterned trace 18 may form the other of the anode or the cathode connection for the LED chip 12. As illustrated, the lumiphoric material region 14 may be provided on a same portion of the second patterned trace 20 and/or the first patterned trace 18 that includes the interface with the LED chip 12, thereby positioning the lumiphoric material region 14 laterally spaced away from both the LED chip 12 and the wire bond 70. Such vertical arrangements for the LED chip 12 may also be provided in any of the LED packages described above for FIGS. 1A, 5A-9, and 12 or in the LED packages described below for FIGS. 13 and 14. Additionally, the first patterned trace 18 may be arranged with two segments on the submount 16 that correspond with anode and cathode connections for the LED chip 12, where each of the two segments is continuous from the LED chip 12 toward perimeter edges of the submount 16. In such a configuration, one or more of the vias 22 may be arranged closer to a perimeter edge of the submount 16 and the lumiphoric material region 14 may be arranged in a position that is vertically aligned with at least one of the vias 22, thereby masking the appearance of the particular via 22. As used herein, vertically aligned is in a direction that is perpendicular to the surface of the submount 16 on which the LED chip 12 is mounted. Such an arrangement may be provided whether the LED chip 12 is a vertical chip as illustrated in FIG. 12, or as a flip-chip configuration as illustrated in previous embodiments, such as FIG. 1A.

Figure 13:
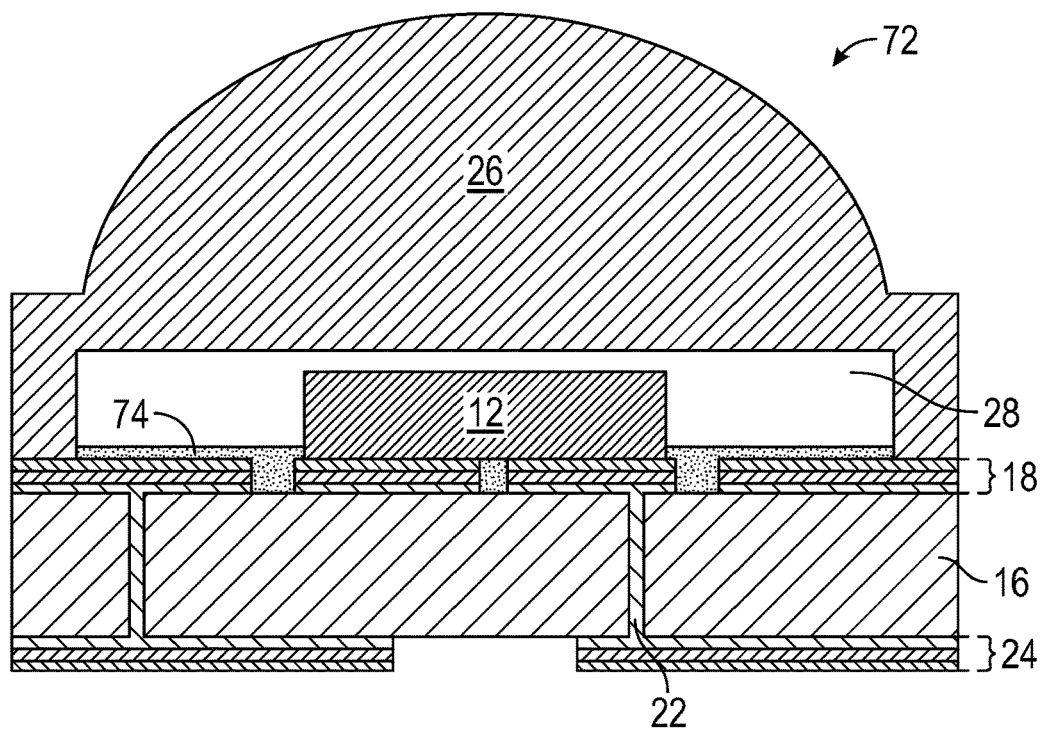
FIG. 13 is a cross-sectional view of an LED package that is similar to the LED package of FIG. 1A except lumiphoric materials for providing wavelength-converted warning emissions may be incorporated within a light-altering material that laterally surrounds one or more portions of the LED chip.

FIG. 13 is a cross-sectional view of an LED package 72 that is similar to the LED package 10 of FIG. 1A except the lumiphoric material region for providing wavelength-converted warning emissions is provided as lumiphoric materials that are incorporated within a light-altering material 74 that laterally surrounds one or more portions of the LED chip 12. As illustrated, the light-altering material 74 may be arranged within the cavity 28 in positions that cover portions of the first patterned trace 18 to define a bottom boundary of the cavity 28. In addition to the lumiphoric materials, the light-altering material 74 may include light-reflective or light-refracting particles that provide increased light extraction for light emitted by the LED chip 12. For UV applications, a binder for the light-altering material 74 may be selected with a material that exhibits reduced degradation under the exposure to UV light. By dispersing a small quantity of lumiphoric material in the light-altering material 74, the LED package 72 may accordingly provide visible and/or nonvisible wavelength-converted emissions as an indication and/or warning that the LED chip 12 is energized without significant impact on purity of emissions. In such a configuration, the lumiphoric material region that is associated with the light-altering material 74 may occupy an entire surface of the submount 16 that is outside of the LED chip 12 and/or portions of the submount 16 where the cover structure 26 is attached.

Figure 14:
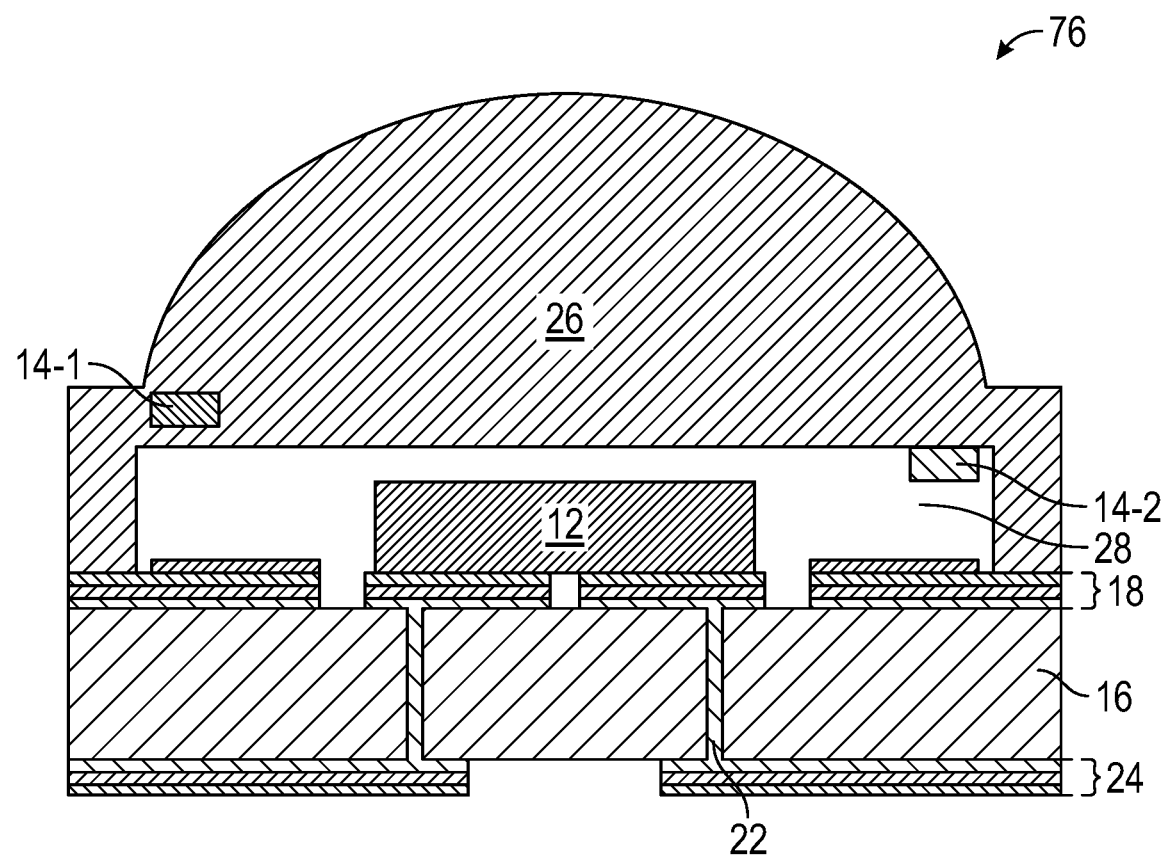
FIG. 14 is a cross-sectional view of an LED package that is similar to the LED package of FIG. 1A except one or more of the lumiphoric material regions may be incorporated on or within the cover structure.

FIG. 14 is a cross-sectional view of an LED package 76 that is similar to the LED package 10 of FIG. 1A except one or more lumiphoric material regions 14-1, 14-2 may be incorporated on or within the cover structure 26. By providing one or more of the lumiphoric material regions 14-1, 14-2 with the cover structure 26 in a pre-formed arrangement, final assembly of the LED package 76 may performed with reduced fabrication steps. As illustrated, the lumiphoric material region 14-1 may be incorporated or embedded within the cover structure 26 such that emissions from the LED chip 12 that reach the lumiphoric material region 14-1 have initially passed through portions of the cover structure 26. Alternatively, the lumiphoric material region 14-2 may be provided as a coating on a surface of the cover structure 26, such as the interior surface that faces the cavity 28. In certain embodiments, one or more of the lumiphoric material regions 14-1, 14-2 are arranged in a position that is laterally spaced from the LED chip 12 in a direction parallel to a surface of the submount 16 on which the LED chip 12 is mounted. This may allow a substantial portion of light emitted from the LED chip 12 to escape the LED package 76 without wavelength conversion, thereby providing high color purity of overall emissions. While both the lumiphoric material region 14-1 and the lumiphoric material region 14-2 are illustrated in FIG. 14, the principles disclosed are equally applicable to embodiments where only a single one of the lumiphoric material regions 14-1, 14-2 is provided.

It is contemplated that any of the foregoing aspects, and/or various separate aspects and features as described herein, may be combined for additional advantage. Any of the various embodiments as disclosed herein may be combined with one or more other disclosed embodiments unless indicated to the contrary herein.

Those skilled in the art will recognize improvements and modifications to the preferred embodiments of the present disclosure. All such improvements and modifications are considered within the scope of the concepts disclosed herein and the claims that follow.

What is claimed is:

1. A light-emitting diode (LED) package comprising:
a support structure comprising at least one of a submount and a lead frame structure;
at least one LED chip on the support structure, wherein the at least one LED chip is configured to emit light with a first peak wavelength in a range from 100 nanometers (nm) to 400 nm; and
a lumiphoric material region that is arranged to receive a portion of the light of the first peak wavelength and provide light with a second peak wavelength that is different than the first peak wavelength;

wherein a combined light output from the at least one LED chip and the lumiphoric material region comprises a purity with respect to the first peak wavelength that is greater than 95%; and wherein a top surface of the at least one LED chip is arranged at a first height above the support structure, a top surface of the lumiphoric material region is arranged at a second height above the support structure, and the second height is less than the first height.

2. The LED package of claim 1, wherein the purity is greater than 99%.

3. The LED package of claim 1, wherein the purity is greater than 99.5%.

4. The LED package of claim 1, wherein the second peak wavelength is in a range from 400 nm to 700 nm.

5. The LED package of claim 1, wherein the second peak wavelength is in a range from 700 nm to 2500 nm.

6. The LED package of claim 1, wherein the first peak wavelength is in a range from 100 nm to 315 nm and the second peak wavelength is in a range from 400 nm to 440 nm.

7. The LED package of claim 1, wherein the lumiphoric material region is a discrete region that is laterally spaced from the at least one LED chip.

8. The LED package of claim 1, wherein a total area of the top surface of the lumiphoric material region is no more than 15% of an area of the top surface of the at least one LED chip.

9. The LED package of claim 1, wherein a total area of the top surface of the lumiphoric material region is at least 50% of an area of the top surface of the at least one LED chip.

10. The LED package of claim 1, wherein the lumiphoric material region comprises phosphor particles in a binder and a ratio of the phosphor particles to the binder is in a range from 5 to 1 to 15 to 1.

11. The LED package of claim 1, wherein the lumiphoric material region comprises at least one of a ceramic material, a phosphor-in-glass structure, and a mixture of phosphor particles and silver.

12. The LED package of claim 1, wherein the lumiphoric material region forms at least one of a polarity indicator, a logo, a symbol, and an alphanumeric character on the submount.

13. The LED package of claim 1, wherein the lumiphoric material region comprises a number of nonplanar features.

14. The LED package of claim 1, wherein the lumiphoric material region is provided within a light-altering material that laterally surrounds the at least one LED chip, wherein the light-altering material comprises at least one of light-reflective particles and light-refractive particles that are dispersed with the lumiphoric material region within a binder.

15. A light-emitting diode (LED) package comprising:
a support structure;
at least one LED chip mounted on a surface of the support structure, wherein the at least one LED chip is configured to emit light with a first peak wavelength in a range from 100 nanometers (nm) to 400 nm; and
a lumiphoric material region that is arranged to receive a portion of the light of the first peak wavelength and provide light with a second peak wavelength that is different than the first peak wavelength, wherein the lumiphoric material region is a discrete region that is laterally spaced from the at least one LED chip in a direction that is parallel to the surface of the support structure on which the at least one LED chip is mounted;

wherein a top surface of the at least one LED chip is arranged at a first height above the support structure, a top surface of the lumiphoric material region is arranged at a second height above the support structure, and the second height is less than the first height.

16. The LED package of claim 15, wherein the support structure is a submount with one or more patterned electrical traces, and the surface of the support structure on which the at least one LED chip is mounted is a portion of the one or more patterned electrical traces.

17. The LED package of claim 16, further comprising a cover structure over the at least one LED chip, wherein the cover structure is attached to a portion of the submount that is adjacent the at least one LED chip.

18. The LED package of claim 17, wherein the lumiphoric material region is arranged at an attachment interface between the cover structure and the submount.

19. The LED package of claim 18, wherein the lumiphoric material region forms a continuous shape that laterally surrounds the at least one LED chip.

20. The LED package of claim 16, further comprising at least one electrically conductive via within the submount, wherein the at least one electrically conductive via is electrically coupled to a portion of the one or more patterned electrical traces, and the lumiphoric material region is vertically aligned with the at least one electrically conductive via.

21. The LED package of claim 15, wherein a concentration of lumiphoric material in the lumiphoric material region is graded.

22. The LED package of claim 15, wherein the support structure is a lead frame structure with one or more metal leads and an insulating housing.

23. The LED package of claim 22, wherein the surface of the support structure on which the at least one LED chip is mounted is a portion of the one or more metal leads.

24. The LED package of claim 22, wherein the surface of the support structure on which the at least one LED chip is mounted is a portion of the insulating housing.

25. A method of fabricating a light-emitting diode (LED) package, the method comprising:
providing a support structure;
mounting at least one LED chip on a surface of the support structure, wherein the at least one LED chip is configured to emit light with a first peak wavelength in a range from 100 nanometers (nm) to 400 nm; and
providing a lumiphoric material region that is arranged to receive a portion of the light of the first peak wavelength and provide light with a second peak wavelength that is different than the first peak wavelength, wherein the lumiphoric material region is a discrete region that is laterally spaced from the at least one LED chip in a direction that is parallel to the surface of the support structure on which the at least one LED chip is mounted;
wherein a top surface of the at least one LED chip is arranged at a first height above the support structure, a top surface of the lumiphoric material region is arranged at a second height above the support structure, and the second height is less than the first height.

26. The method of claim 25, wherein providing the lumiphoric material region comprises selectively depositing the lumiphoric material region on a portion of the support structure.

27. The method of claim 26, wherein providing the lumiphoric material region comprises forming the lumiphoric material region as a pre-formed structure and attaching the pre-formed structure to the support structure.

28. The method of claim 25, further comprising:
providing a cover structure that is attached to the support structure over the at least one LED chip;
wherein providing the lumiphoric material region comprises providing the lumiphoric material region on or within a portion of the cover structure.

29. The method of claim 25, wherein a combined light output from the at least one LED chip and the lumiphoric material region comprises a purity with respect to the first peak wavelength.

30. The method of claim 25, wherein a total area of the lumiphoric material region is no more than 15% of an area of the top surface of the at least one LED chip.

31. The method of claim 25, wherein a total area of the lumiphoric material region is at least 50% of an area of the top surface of the at least one LED chip.

32. The method of claim 25, wherein the lumiphoric material region comprises phosphor particles in a binder and a ratio of the phosphor particles to the binder is in a range from 5 to 1 to 15 to 1.

* * * * *